(12) United States Patent
Ohmi et al.

(10) Patent No.: US 6,559,674 B2
(45) Date of Patent: May 6, 2003

(54) VARIABLE FUNCTION INFORMATION PROCESSOR

(75) Inventors: Tadahiro Ohmi, 1-17-301, Komegabukuro 2-chome, Aoba-ku, Sendai-shi, Miyagi, 980-0813 (JP); Satoshi Sakaidani, Miyagi (JP); Naoto Miyamoto, Miyagi (JP); Akira Nakada, Miyagi (JP); Shigetoshi Sugawa, Miyagi (JP)

(73) Assignee: Tadahiro Ohmi, Miyagi (JP)

( * ) Notice: Subject to any disclaimer, the term of this patent is extended or adjusted under 35 U.S.C. 154(b) by 0 days.

(21) Appl. No.: 10/088,603

(22) PCT Filed: Jul. 18, 2001

(86) PCT No.: PCT/JP01/06220

§ 371 (c)(1),
(2), (4) Date: Mar. 19, 2002

(87) PCT Pub. No.: WO02/07318

PCT Pub. Date: Jan. 24, 2002

(65) Prior Publication Data

US 2002/0138530 A1 Sep. 26, 2002

(30) Foreign Application Priority Data

Jul. 19, 2000 (JP) ........................................ 2000-253141

(51) Int. Cl.[7] ...................... H03K 19/173; H03K 19/21; G06F 7/38
(52) U.S. Cl. .............................. 326/46; 326/37; 326/54; 708/230
(58) Field of Search ............................... 326/37–40, 46, 326/52–55; 708/230, 232

(56) References Cited

U.S. PATENT DOCUMENTS 3,767,906 A * 10/1973 Pryor ........................ 708/230
6,188,240 B1 * 2/2001 Nakaya ....................... 326/39

FOREIGN PATENT DOCUMENTS

JP 55095147 A * 7/1980 ............. G06F/7/00

OTHER PUBLICATIONS

Patent Abstract of Japan, Publication No. 09284124 A, Publication Date Oct. 31, 1997.

* cited by examiner

Primary Examiner—Michael Tokar
Assistant Examiner—James H Cho
(74) Attorney, Agent, or Firm—Arent Fox Kintner Plotkin & Kahn, PLLC

(57) ABSTRACT

There can be provided a variable function information processor in which a logic module (10) with the further decreased number of transistors used in the logic module constituting the variable function information processor is provided, a function of being able to realize both a combinational logic circuit for-performing a full addition operation of input signals in accordance with a control signal and outputting the sum and a sequential circuit for temporarily holding the input signal to delay the signal and outputting it by the same logic module is provided, and in a semiconductor circuit element group for constituting the combinational logic circuit and the sequential circuit, a common part of the combinational logic circuit and the sequential circuit is used for both the circuits, whereby the number of elements can be further decreased, and the resources of the variable function information processor can be effectively exploited.

19 Claims, 20 Drawing Sheets

VARIABLE FUNCTION INFORMATION PROCESSOR

TECHNICAL FIELD

The present invention relates to a variable function information processor.

BACKGROUND ART

Conventionally, there exists a variable function information processing circuit whose circuit configuration can be changed by being defined. Also, there exists a variable function information processor using the variable function information processing circuit. A logic module constituting the variable function information processing circuit used in the conventional variable function information processor constitutes an information processing circuit for performing desired processing by a method of performing a combinational logic operation by a certain part of an arithmetic circuit in the logic module and performing a sequential operation by another certain part of the arithmetic circuit. Namely, the logic module constituting the conventional variable function information processing circuit is structured to include a part for performing a combinational logic operation and a part for performing a sequential operation different from the part for performing the combinational logic operation.

Therefore, when the logic module is used for a certain combinational logic operation (the part for performing the combinational logic operation is used), the part of the arithmetic circuit for performing the sequential operation is not used, and similarly, when the logic module is used for a certain sequential operation (the part for performing the sequential operation is used), the part of the arithmetic circuit for performing the combinational logic operation is not used. Hence, when a variable function information processor for performing desired processing is structured using the variable function information processing circuit, the resources of the variable function information processor are not effectively exploited, thereby causing waste.

As a logic module to solve this problem, the invention disclosed in Japanese Patent Laid-open No. 9-284124 (hereinafter referred to as "a conventional example") is given. In the conventional example, a logic module is structured so as to perform a combinational logic operation function of more than 2,200 Boolean algebras or perform a sequential operation function of a D-type latch or D-type flip-flop, and both a combinational circuit and a sequential circuit are formed by using the logic module, whereby a space on a gate array is efficiently used.

The logic module in the conventional example is, however, composed of three two-input multiplexers and three two-input multiplexers with inverting inputs, and uses 42 transistors in total. The smaller the number of transistors constituting one logic module, the more the number of logic modules integrated on one LSI chip becomes, whereby a high-performance and advanced information processor can be realized. Accordingly, it is preferable that the number of transistors constituting a logic module be smaller.

SUMMARY OF THE INVENTION

A problem to be solved of the present invention is to provide a variable function information processor which uses a logic module with the further decreased number of transistors to be used in order that logic modules constituting the variable function information processor are increased in number, that is, integrated at a high degree of integration.

Another problem to be solved of the present invention is to realize both a combinational logic circuit and a sequential circuit by the same logic module, whereby the resources of a variable function information processor are effectively exploited.

A variable function information processor of the present invention is characterized by comprising: at least one basic circuit block composed of a two-input arithmetic circuit structured by a two-input exclusive-NOR circuit or a two-input exclusive-OR circuit, to which a first signal is inputted as one input signal from a first input terminal, an inverter for inverting an output signal of the two-input arithmetic circuit, a switching circuit for transmitting an output signal of the inverter or a second signal inputted from a second input terminal as the other input signal to the two-input arithmetic circuit in accordance with a third signal inputted from a third input terminal, and an output terminal capable of outputting at least either the output signal of the two-input arithmetic circuit or the output signal of the inverter; an input terminal group including the first to third input terminals; an output terminal group including the output terminal; and a semiconductor arithmetic circuit electrically connected to the input terminal group, the output terminal group, and the basic circuit block, wherein a function of serving both as a combinational logic circuit for performing a logical operation of the input signals and as a sequential circuit for performing a sequential operation of the input signal according to the input signals inputted from the input terminal group is provided, and through the use of the basic circuit block, in a semiconductor circuit element group for constituting the combinational logic circuit and the sequential circuit, a common part of the combinational logic circuit and the sequential circuit is used for both the circuits.

Another aspect of the variable function information processor of the present invention is characterized in that the semiconductor arithmetic circuit includes an output switching circuit for selectively outputting any of the input signals inputted from the input terminal group.

Another aspect of the variable function information processor of the present invention is characterized in that a first and a second basic circuit block are provided, and the first basic circuit block includes: a first two-input arithmetic circuit structured by a first two-input exclusive-NOR circuit or a first two-input exclusive-OR circuit, to which a first signal is inputted as one input signal from a first input terminal; a first inverter for inverting an output signal of the first two-input arithmetic circuit; and a first switching circuit for transmitting an output signal of the first inverter or a second signal inputted from a second input terminal as the other input signal to the first two-input arithmetic circuit in accordance with a third signal inputted from a third input terminal, the first basic circuit block outputting the output signal of the first two-input arithmetic circuit or the output signal of the first inverter as an output signal of the first basic circuit block, the second basic circuit block includes: a second two-input arithmetic circuit structured by a second two-input exclusive-NOR circuit or a second two-input exclusive-OR circuit, to which a fourth signal is inputted as one input signal from a fourth input terminal; a second inverter for inverting an output signal of the second two-input arithmetic circuit; and a second switching circuit for transmitting an output signal of the second inverter or the output signal of the first basic circuit block as the other input signal to the second two-input arithmetic circuit in accordance with a fifth signal inputted from a fifth input terminal, the second basic circuit block outputting the output signal of the second two-input arithmetic circuit or the output signal of the second inverter via a first external output terminal, the semiconductor arithmetic circuit transmits a sixth signal inputted from a sixth input terminal or a seventh signal inputted from a seventh input terminal to a second external output terminal in accordance with at least either the output signal of the first two-input arithmetic circuit or the output signal of the first inverter, a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and that in a semiconductor circuit element group for constituting the combinational logic circuit and the sequential circuit, a common part of the combinational logic circuit and the sequential circuit is used for both the circuits.

Another aspect of the variable function information processor of the present invention is characterized in that a first and a second basic circuit block are provided, and the first basic circuit block includes: a first two-input exclusive-NOR circuit, to which a first signal is inputted as one input signal from a first input terminal; a first inverter for inverting an output signal of the first two-input exclusive-NOR circuit; and a first switching circuit for transmitting an output signal of the first inverter or a second signal inputted from a second input terminal as the other input signal to the first two-input exclusive-NOR circuit in accordance with a third signal inputted from a third input terminal, the second basic circuit block includes: a second two-input exclusive-NOR circuit, to which a fourth signal is inputted as one input signal from a fourth input terminal, for outputting an output signal via a first external output terminal; a second inverter for inverting the output signal of the second two-input exclusive-NOR circuit; and a second switching circuit for transmitting an output signal of the second inverter or the output signal of the first two-input exclusive-NOR circuit as the other input signal to the second two-input exclusive-NOR circuit in accordance with a fifth signal inputted from a fifth input terminal, the semiconductor arithmetic circuit transmits a sixth signal inputted from a sixth input terminal or a seventh signal inputted from a seventh input terminal to a second external output terminal in accordance with at least either the output signal of the first two-input exclusive-NOR circuit or the output signal of the first inverter, a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and that in a semiconductor circuit element group for constituting the combinational logic circuit and the sequential circuit, a common part of the combinational logic circuit and the sequential circuit is used for both the circuits.

Another aspect of the variable function information processor of the present invention is characterized in that a first and a second basic circuit block are provided, and the first basic circuit block includes: a two-input exclusive-NOR circuit, to which a first signal is inputted as one input signal from a first input terminal; a first inverter for inverting an output signal of the first two-input exclusive-NOR circuit; and a first switching circuit for transmitting an output signal of the first inverter or a second signal inputted from a second input terminal as the other input signal to the two-input exclusive-NOR circuit in accordance with a third signal inputted from a third input terminal, the second basic circuit block includes: a two-input exclusive-OR circuit, to which a fourth signal is inputted as one input signal from a fourth input terminal; a second inverter for inverting an output signal of the two-input exclusive-OR circuit and outputting an output signal via a first external output terminal; and a second switching circuit for transmitting the output signal of the second inverter or the output signal of the two-input exclusive-NOR circuit as the other input signal to the two-input exclusive-OR circuit in accordance with a fifth signal inputted from a fifth input terminal, the semiconductor arithmetic circuit transmits a sixth signal inputted from a sixth input terminal or a seventh signal inputted from a seventh input terminal to a second external output terminal in accordance with at least either the output signal of the two-input exclusive-NOR circuit or the output signal of the first inverter, a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and that in a semiconductor circuit element group for constituting the combinational logic circuit and the sequential circuit, a common part of the combinational logic circuit and the sequential circuit is used for both the circuits.

Another aspect of the variable function information processor of the present invention is characterized in that a first and a second basic circuit block are provided, and the first basic circuit block includes: a two-input exclusive-OR circuit, to which a first signal is inputted as one input signal from a first input terminal; a first inverter for inverting an output signal of the two-input exclusive-OR circuit; and a first switching circuit for transmitting an output signal of the first inverter or a second signal inputted from a second input terminal as the other input signal to the two-input exclusive-OR circuit in accordance with a third signal inputted from a third input terminal, the second basic circuit block includes: a two-input exclusive-NOR circuit, to which a fourth signal is inputted as one input signal from a fourth input terminal, for outputting an output signal via a first external output terminal; a second inverter for inverting the output signal of the two-input exclusive-NOR circuit; and a second switching circuit for transmitting an output signal of the second inverter or the output signal of the first inverter as the other input signal to the two-input exclusive-NOR circuit in accordance with a fifth signal inputted from a fifth input terminal, the semiconductor arithmetic circuit transmits a sixth signal inputted from a sixth input terminal or a seventh signal inputted from a seventh input terminal to a second external output terminal in accordance with at least either the output signal of the two-input exclusive-OR circuit or the output signal of the first inverter, a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and that in a semiconductor circuit element group for constituting the combinational logic circuit and the sequential circuit, a common part of the combinational logic circuit and the sequential circuit is used for both the circuits.

Another aspect of the variable function information processor of the present invention is characterized in that a first and a second basic circuit block are provided, and the first basic circuit block includes: a first two-input exclusive-OR circuit, to which a first signal is inputted as one input signal from a first input terminal; a first inverter for inverting an output signal of the first two-input exclusive-OR circuit; and a first switching circuit for transmitting an output signal of the first inverter or a second signal inputted from a second input terminal as the other input signal to the first two-input exclusive-OR circuit in accordance with a third signal inputted from a third input terminal, the second basic circuit block includes: a second two-input exclusive-OR circuit, to which a fourth signal is inputted as one input signal from a fourth input terminal; a second inverter for inverting an output signal of the second two-input exclusive-OR circuit and outputting an output signal via a first external output terminal; and a second switching circuit for transmitting the output signal of the second inverter or the output signal of the first inverter as the other input signal to the second two-input exclusive-OR circuit in accordance with a fifth signal inputted from a fifth input terminal, the semiconductor arithmetic circuit transmits a sixth signal inputted from a sixth input terminal or a seventh signal inputted from a seventh input terminal to a second external output terminal in accordance with at least either the output signal of the first two-input exclusive-OR circuit or the output signal of the first inverter, a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and that in a semiconductor circuit element group for constituting the combinational logic circuit and the sequential circuit, a common part of the combinational logic circuit and the sequential circuit is used for both the circuits.

Another aspect of the variable function information processor of the present invention is characterized in that a first and a second basic circuit block are provided, and the first basic circuit block includes: a first two-input exclusive-NOR circuit, to which a first signal is inputted as one input signal from a first input terminal; a first inverter for inverting an output signal of the first two-input exclusive-NOR circuit; and a first switching circuit for transmitting an output signal of the first inverter or a second signal inputted from a second input terminal as the other input signal to the first two-input exclusive-NOR circuit in accordance with a third signal inputted from a third input terminal, the second basic circuit block includes: a second two-input exclusive-NOR circuit, to which a fourth signal is inputted as one input signal from a fourth input terminal; a second inverter for inverting an output signal of the two-input exclusive-NOR circuit and outputting an output signal via a first external output terminal; and a second switching circuit for transmitting the output signal of the second inverter or the output signal of the first inverter as the other input signal to the second two-input exclusive-NOR circuit in accordance with a fifth signal inputted from a fifth input terminal, the semiconductor arithmetic circuit transmits a sixth signal inputted from a sixth input terminal or a seventh signal inputted from a seventh input terminal to a second external output terminal in accordance with at least either the output signal of the first two-input exclusive-NOR circuit or the output signal of the first inverter, a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and that in a semiconductor circuit element group for constituting the combinational logic circuit and the sequential circuit, a common part of the combinational logic circuit and the sequential circuit is used for both the circuits.

Another aspect of the variable function information processor of the present invention is characterized in that a first and a second basic circuit block are provided, and the first basic circuit block includes: a two-input exclusive-NOR circuit, to which a first signal is inputted as one input signal from a first input terminal; a first inverter for inverting an output signal of the two-input exclusive-NOR circuit; and a first switching circuit for transmitting an output signal of the first inverter or a second signal inputted from a second input terminal as the other input signal to the two-input exclusive-NOR circuit in accordance with a third signal inputted from a third input terminal, the second basic circuit block includes: a two-input exclusive-OR circuit, to which a fourth signal is inputted as one input signal from a fourth input terminal and outputting an output signal via a first external output terminal; a second inverter for inverting the output signal of the two-input exclusive-OR circuit; and a second switching circuit for transmitting an output signal of the second inverter or the output signal of the first inverter as the other input signal to the two-input exclusive-OR circuit in accordance with a fifth signal inputted from a fifth input terminal, the semiconductor arithmetic circuit transmits a sixth signal inputted from a sixth input terminal or a seventh signal inputted from a seventh input terminal to a second external output terminal in accordance with at least either the output signal of the two-input exclusive-NOR circuit or the output signal of the first inverter, a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and that in a semiconductor circuit element group for constituting the combinational logic circuit and the sequential circuit, a common part of the combinational logic circuit and the sequential circuit is used for both the circuits.

Another aspect of the variable function information processor of the present invention is characterized in that a first and a second basic circuit block are provided, and the first basic circuit block includes: a two-input exclusive-OR circuit, to which a first signal is inputted as one input signal from a first input terminal; a first inverter for inverting an output signal of the two-input exclusive-OR circuit; and a first switching circuit for transmitting an output signal of the first inverter or a second signal inputted from a second input terminal as the other input signal to the two-input exclusive-OR circuit in accordance with a third signal inputted from a third input terminal, the second basic circuit block includes: a two-input exclusive-NOR circuit, to which a fourth signal is inputted as one input signal from a fourth input terminal; a second inverter for inverting the output signal of the two-input exclusive-NOR circuit and outputting an output signal via a first external output terminal; and a second switching circuit for transmitting the output signal of the second inverter or the output signal of the two-input exclusive-OR circuit as the other input signal to the second two-input exclusive-NOR circuit in accordance with a fifth signal inputted from a fifth input terminal, the semiconductor arithmetic circuit transmits a sixth signal inputted from a sixth input terminal or a seventh signal inputted from a seventh input terminal to a second external output terminal in accordance with at least either the output signal of the two-input exclusive-OR circuit or the output signal of the first inverter, a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and that in a semiconductor circuit element group for constituting the combinational logic circuit and the sequential circuit, a common part of the combinational logic circuit and the sequential circuit is used for both the circuits.

Another aspect of the variable function information processor of the present invention is characterized in that a first and a second basic circuit block are provided, and the first basic circuit block includes: a first two-input exclusive-OR circuit, to which a first signal is inputted as one input signal from a first input terminal; a first inverter for inverting an output signal of the first two-input exclusive-OR circuit; and a first switching circuit for transmitting an output signal of the first inverter or a second signal inputted from a second input terminal as the-other input signal to the first two-input exclusive-OR circuit in accordance with a third signal inputted from a third input terminal, the second basic circuit block includes: a second two-input exclusive-OR circuit, to which a fourth signal is inputted as one input signal from a fourth input terminal, for outputting an output signal via a first external output terminal; a second inverter for inverting the output signal of the second two-input exclusive-OR circuit; and a second switching circuit for transmitting an output signal of the second inverter or-the output signal of the first two-input exclusive-OR circuit as the other input signal to the second two-input exclusive-OR circuit in accordance with a fifth signal inputted from a fifth input terminal, the semiconductor arithmetic circuit transmits a sixth signal inputted from a sixth input terminal or a seventh signal inputted from a seventh input terminal to a second external output terminal in accordance with at least either the output signal of the first two-input exclusive-OR circuit or the output signal of the first inverter, a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and that in a semiconductor circuit element group for constituting the combinational logic circuit and the sequential circuit, a common part of the combinational logic circuit and the sequential circuit is used for both the circuits.

Another aspect of the variable function information processor of the present invention is characterized in that the variable function information processor further comprises a third two-input arithmetic circuit structured by a third two-input exclusive-NOR circuit or a third two-input exclusive-OR circuit, whose output terminal is electrically connected to at least one of the first to seventh input terminals, a function of serving both as a combinational logic circuit for performing an addition operation or a subtraction operation of a set of the input signals and outputting a result of the operation and as a sequential circuit for temporarily holding the input signal to delay the input signal and outputting it according to input signals inputted from input terminals for inputting input signals to the third two-input arithmetic circuit and the first to seventh input terminals is provided, and that in a semiconductor circuit element group for constituting the combinational logic circuit and the sequential circuit, a common part of the combinational logic circuit and the sequential circuit is used for both the circuits.

Another aspect of-the variable function information processor of the present invention is characterized in that a plurality of the aforementioned variable function information processors are provided and electrically connected to one another directly or via a semiconductor arithmetic circuit, whereby a new input terminal group is formed by a plurality of input terminals through which input signals are allowed to be inputted from the outside to the variable function information processor, and a new output terminal group is formed by a plurality of output terminals through which output signals are allowed to be inputted from the variable function information processor to the outside, a function of serving both as a combinational logic circuit and a sequential circuit according to the input signals inputted from the input terminal group is provided, and that in a semiconductor circuit element group to constitute the combinational logic circuit and the sequential circuit, a common part of the combinational logic circuit and the sequential circuit is used for both the circuits.

Another aspect of the variable function information processor of the present invention is characterized in that the variable function information processor comprises: at least one basic circuit block composed of a two-input arithmetic circuit, to which a first signal is inputted as one input signal from a first input terminal, for outputting an operation result of a predetermined logical operation of the first signal and the other input signal or an inverted signal of the other input signal according to the first signal, an inverter for inverting the output signal of the two-input arithmetic circuit, a switching circuit for selectively supplying an output signal of the inverter or a second signal inputted from a second input terminal as the other input signal to the two-input arithmetic circuit in accordance with a third signal inputted from a third input terminal, and an output terminal capable of outputting at least either the output signal of the two-input arithmetic circuit or the output signal of the inverter, the basic circuit block serving both as a combinational logic circuit and as a sequential circuit according to the input signals inputted from the first to third input terminals, and in semiconductor circuit elements to function as the combinational logic circuit and the sequential circuit respectively, sharing a common circuit element between both the circuits.

Another aspect of the variable function information processor of the present invention is characterized in that a plurality of the basic circuit blocks are provided, and that on the occasion of subordinate connection, the output terminal of the basic circuit block in a preceding stage is connected to the second input terminal of the basic circuit block in a subsequent stage.

Another aspect of the variable function information processor of the present invention is characterized in that the two-input arithmetic circuit is a two-input exclusive-NOR circuit or a two-input exclusive-OR circuit.

Another aspect of the variable function information processor of the present invention is characterized in that the basic circuit block functions as an adding circuit or a latch circuit according to the input signal inputted from the first input terminal.

Another aspect of the variable function information processor of the present invention is characterized in that the variable function information processor further comprises: a semiconductor arithmetic circuit for performing predetermined processing in response to a signal inputted; and an external output terminal capable of outputting an output signal of the semiconductor arithmetic circuit, the semiconductor arithmetic circuit performing the predetermined processing in response to at least any one signal of the input signal inputted from the first to third input terminals or an external input terminal, the output signal of the two-input arithmetic circuit, and the output signal of the inverter.

Another aspect of the variable function information processor of the present invention is characterized in that the semiconductor arithmetic circuit includes an output switching circuit for outputting the input signal inputted from the first to third input terminals or the external input terminal according to at least either the output signal of the two-input arithmetic circuit or the output signal of the inverter.

DETAILED DESCRIPTION OF THE PREFERRED EMBODIMENTS

Embodiments will be given below to explain the present invention in detail, but it is needless to say that the present invention is not limited to these embodiments. Features, properties, and various advantages of the present invention, however, will become more apparent from the accompanying drawings and the following detailed description of preferred embodiments.

The embodiments of the present invention will be explained below based on the drawings.

First Embodiment

Regarding a logic module constituting a variable function information processor according to the first embodiment of the present invention, its configuration and operation will be explained.

Figure 1:
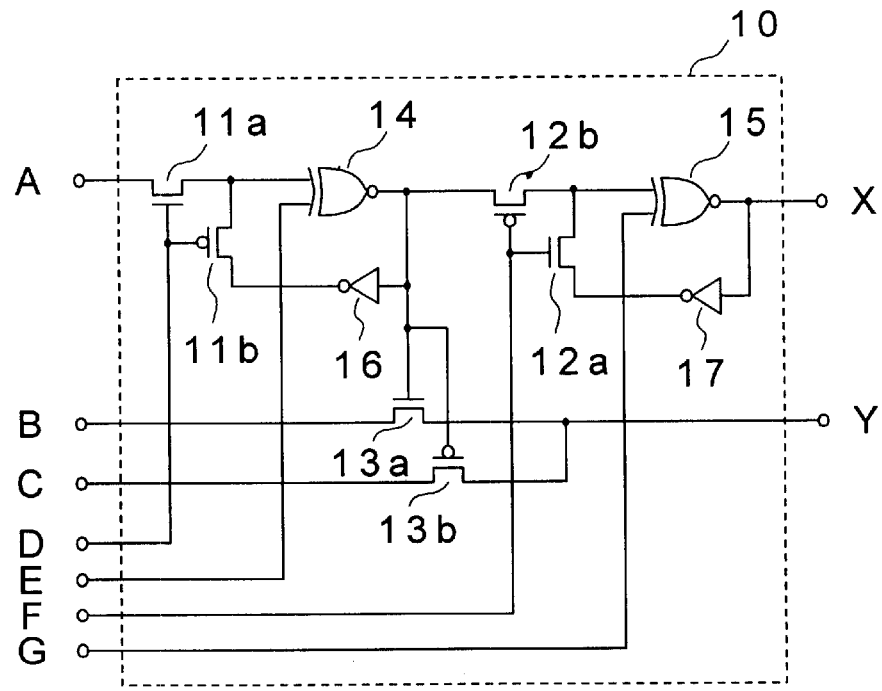
FIG. 1 is a diagram showing an example of a configuration of a logic module constituting a variable function information processor according to a first embodiment of the present invention.

FIG. 1 is a diagram showing an example of the configuration of the logic module in the first embodiment.

In FIG. 1, a switching circuit 11a selects whether or not to output a signal Sa inputted from an input terminal A, and a switching circuit 11b selects whether or not to output an output signal of an inverter 16. The switching circuits 11a and 11b are designed such that either of them selectively becomes ON according to a signal Sd inputted from an input terminal D to transmit the signal Sa or the output signal of the inverter 16 to a two-input exclusive-NOR circuit 14 as one input signal. The other input signal of the two-input exclusive-NOR circuit 14 is a signal Se inputted from an input terminal E. An output signal of the two-input exclusive-NOR circuit 14 (a signal outputted as a result of an operation by the two-input exclusive-NOR circuit 14) is inputted as an input signal to the inverter 16.

A switching circuit 12a selects whether or not to output an output signal of an inverter 17, and a switching circuit 12b selects whether or not to output the output signal of the two-input exclusive-NOR circuit 14. The switching circuits 12a and 12b are designed to selectively become ON according to a signal Sf inputted from an input terminal F and transmit the output signal of the inverter 17 or the output signal of the two-input exclusive-NOR circuit 14 to a two-input exclusive-NOR circuit 15 as one input signal. The other input signal of the two-input exclusive-NOR circuit 15 is a signal Sg inputted from an input terminal G. An output signal of the two-input exclusive-NOR circuit 15 is inputted as an input signal to the inverter 17.

Further, an output terminal of the two-input exclusive-NOR circuit 15 and an output terminal X of a logic module 10 are connected to each other, and the output signal of the two-input exclusive-NOR circuit 15 is outputted as an output signal Sx of the logic module 10. Furthermore, the output signal of the two-input exclusive-NOR circuit 14 is supplied to switching circuits 13a and 13b respectively. The switching circuits 13a and 13b are controlled by the output signal of the two-input exclusive-NOR circuit 14 so that a signal Sb inputted from an input terminal B or a signal Sc inputted from an input terminal C is selectively transmitted to an output terminal Y. Thus, the signal Sb or Sc transmitted selectively is outputted from the output terminal Y as an output signal Sy of the logic module 10.

In FIG. 1, a logic high (high-level signal) is applied to the switching circuits 11a and 11b from the input terminal D and a logic low (low-level signal) is applied to the switching circuits 12a and 12b from the input terminal F so that the switching circuits 11a and 12b become ON and that the switching circuits 11b and 12a become OFF. Moreover, an input signal Ia is inputted from the input terminal A, an input signal Ib is inputted from each of the input terminals B and E, and similarly an input signal Ic is inputted from each of the input terminals C and G. On this occasion, a sum and a carry of the input signals Ia, Ib, and Ic are outputted respectively as the output signals Sx (sum) and Sy (carry) from the output terminals X and Y. Namely, the logic module 10 operates as a full adding circuit of a combinational logic circuit.

More specifically, the input signal Ia and the input signal Ia are operated in the two-input exclusive-NOR circuit 14, and an operation result in the two-input exclusive-NOR circuit 14 (negation of the sum of the input signal Ia and the input signal Ib) and the input signal Ic are operated in the two-input exclusive-NOR circuit 15. An operation result in the two-input exclusive-NOR circuit 15 is outputted as the output signal Sx from the output terminal X. When logical values of the input signal Ia and the input signal Ia are the same, the switching circuit 13a is ON and the switching circuit 13b is OFF, whereby the input signal Ia is outputted as the output signal Sy from the output terminal Y. When they are different, the switching circuit 13a is OFF and the switching circuit 13b is ON, whereby the input signal Ic is outputted as the output signal Sy from the output terminal Y. Namely, when both of the input signals Ia and Ib are "0" or "1", irrespective of the input signal Ic, the input signal Ib is outputted as a carry of the input signals Ia, Ib, and Ic from the output terminal Y. When one of the input signals Ia and Ib is "0" and the other is "1", the input signal Ic is outputted as a carry of the input signals Ia, Ib, and Ic from the output terminal Y.

Moreover, in FIG. 1, logic lows are applied from the input terminals E and G to the two-input exclusive-NOR circuits 14 and 15 respectively so that the two-input exclusive-NOR circuits 14 and 15 substantially operate as inverters, and clock signals are inputted from the input terminals D and F to the switching circuits 11a and 11b, and 12a and 12b. On this occasion, the input signal Ia inputted from the input terminal A is delayed in synchronization with the clock signals and outputted as the output signal Sx from the output terminal X. In other words, the logic module 10 operates as a delay circuit (D-type flip-flop) of a sequential circuit. Incidentally, when the logic module 10 is operated as the delay circuit of the sequential circuit, input signals inputted from the input terminals B and C are optional.

The cases where the logic module shown in FIG. 1 operates as the full adding circuit (full adder) and operates as the delay circuit (D-type flip-flop) are explained above, but operations by the logic module shown in FIG. 1 are not limited to the aforementioned two operations. It is needless to say that in the logic module in the first embodiment of the present invention, by inputting predetermined input signals from the input terminals A to G, various kinds of combinational logic circuits including a selector circuit which selects any one of inputted input signals and outputs it, for example, can be realized.

Figure 2:
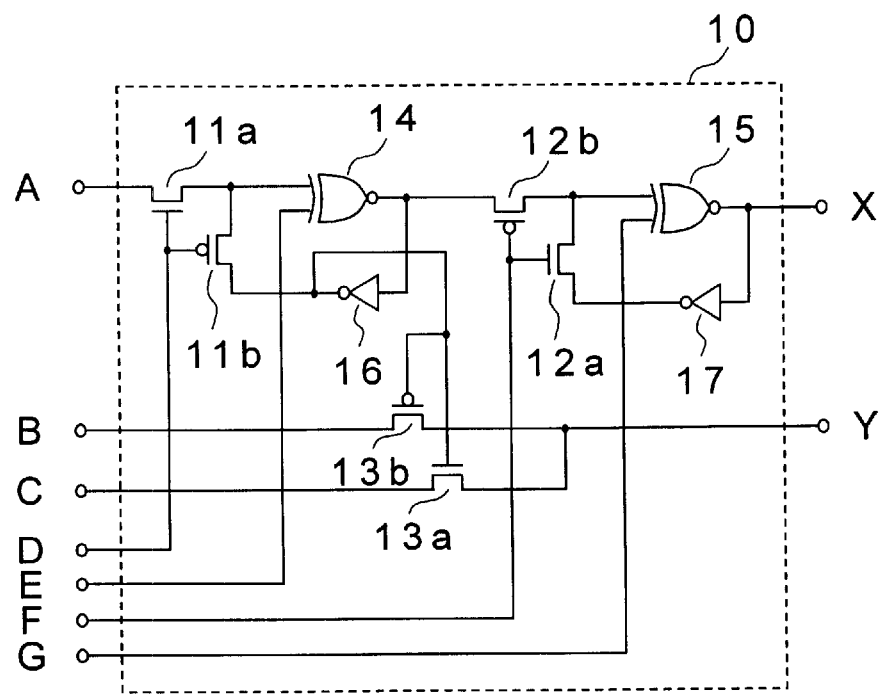
FIG. 2 is a diagram showing another example of the configuration of the logic module constituting the variable function information processor according to the first embodiment of the present invention.
Figure 3:
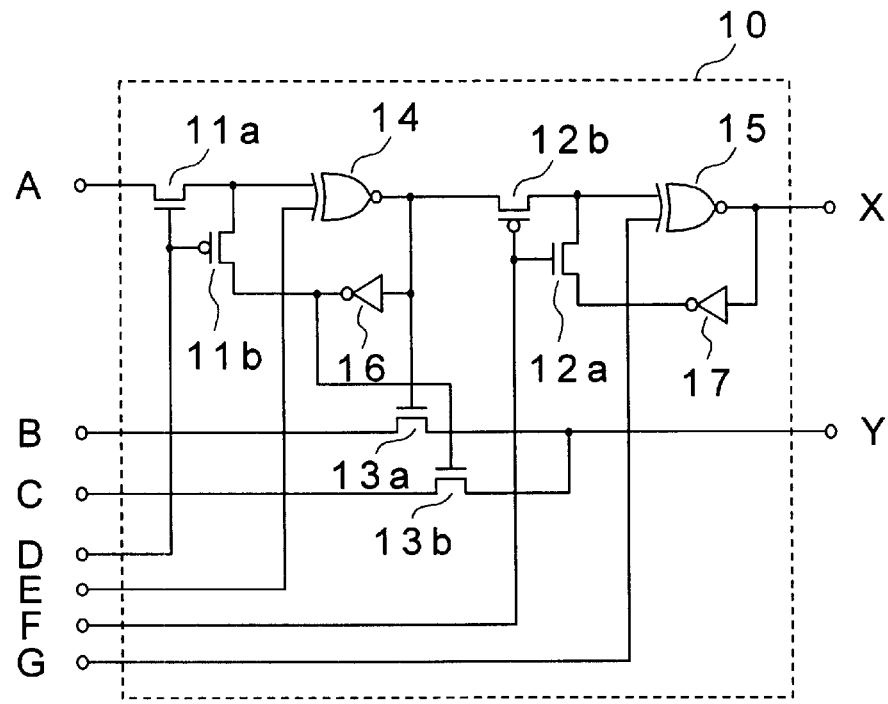
FIG. 3 is a diagram showing still another example of the configuration of the logic module constituting the variable function information processor according to the first embodiment of the present invention.
Figure 4:
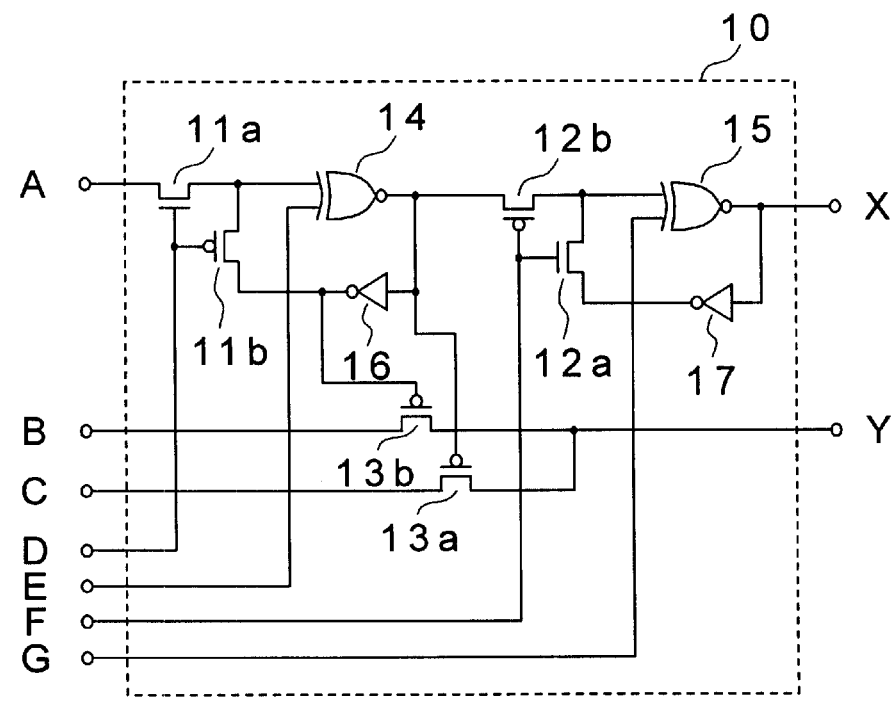
FIG. 4 is a diagram showing yet another example of the configuration of the logic module constituting the variable function information processor according to the first embodiment of the present invention.

FIG. 2 to FIG. 4 are diagrams showing other examples of the configuration of the logic module in the first embodiment.

The logic module 10 shown in each of FIG. 2 to FIG. 4 and the logic module 10 shown in FIG. 1 are different in a signal for controlling the switching circuits 13a and 13b for selectively transmitting the signals Sb and Sc inputted respectively from the input terminals B and C to the output terminal Y, and the configurations of the logic modules 10 shown in FIG. 2 to FIG. 4 and the configuration of the logic module 10 shown in FIG. 1 are different from each other. The signal for controlling the switching circuits 13a and 13b is the output signal of the inverter 16 in the logic module 10 shown in FIG. 2, but both the output signal of the two-input exclusive-NOR circuit 14 and the output signal of the inverter 16 in the logic module 10 shown in each of FIG. 3 and FIG. 4. Moreover, with the difference between the signals for controlling the switching circuits 13a and 13b, logic values (a logic high, a logic low) at which the switching circuits 13a and 13b operate also differ according to supplied signals.

It should be mentioned that the operations of the logic modules 10 shown in FIG. 2 to FIG. 4 are the same as that of the logic module shown in FIG. 1.

As explained above, according to the first embodiment, by configuring the logic module 10 as shown in each of FIG. 1 to FIG. 4, both the full adding circuit which is the combinational logic circuit and the delay circuit which is the sequential circuit can be realized by the same logic module 10. Further, by using a common part of a semiconductor circuit element group constituting the full adding circuit and the delay circuit respectively for both the circuits, the number of transistors constituting the logic module 10 can be effectively decreased.

Figure 33A:
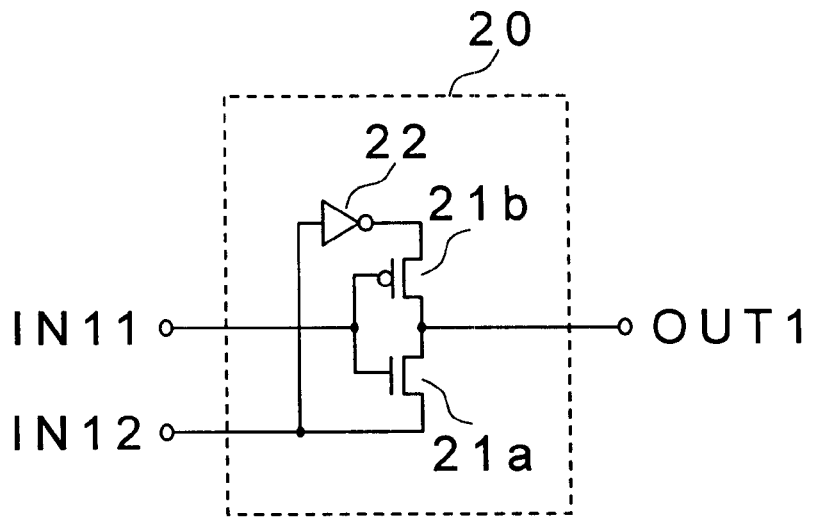
FIG. 33A and FIG. 33B are diagrams each showing an example of a configuration of a two-input exclusive-NOR circuit.
Figure 33B:
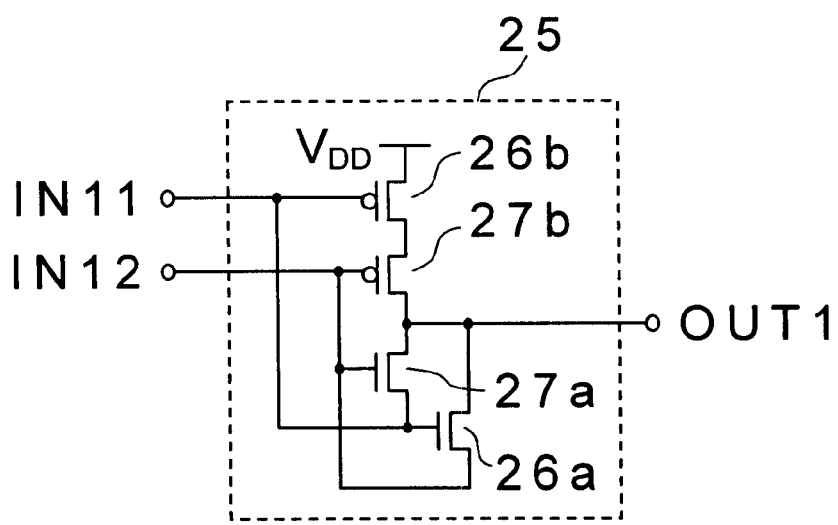

In this case, the two-input exclusive-NOR circuits 14 and 15 shown in FIG. 1 to FIG, 4 can be structured, for example, by circuits shown in FIG. 33A and FIG. 33B. FIG. 33A and FIG. 33B are diagrams each showing an example of the two-input exclusive-NOR circuit. Incidentally, the configurations and operations of the two-input exclusive-NOR circuits shown in FIG. 33A and FIG. 33B will be described later. By using such a circuit as shown in FIG. 33A or FIG. 33B, the two-input exclusive-NOR circuits 14 and 15 each can be composed of four transistors, whereby the number of transistors composing the logic module 10 can be effectively decreased.

In the logic module 10 in the first embodiment shown in each of FIG. 1 to FIG. 4, the number of transistors necessary to constitute the logic module 10 is 18, and consequently a function almost equal to that in the aforementioned conventional example can be realized by the number of transistors not more than a half of 42 which is the number of transistors necessary in the aforementioned conventional example.

Second Embodiment

Next, regarding a logic module constituting a variable function information processor according to the second embodiment of the present invention, its configuration and operation will be explained.

Figure 5:
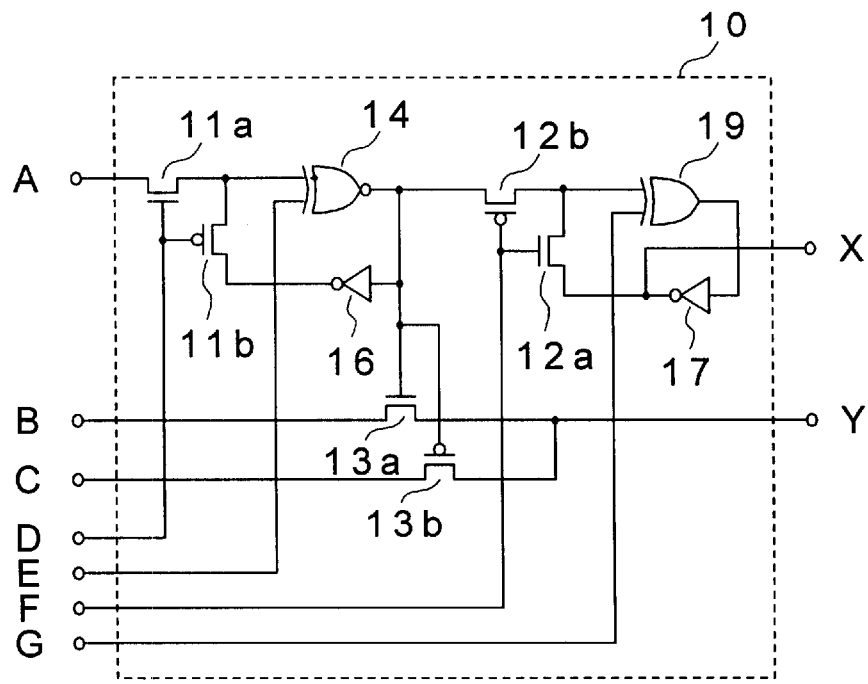
FIG. 5 is a diagram showing an example of a configuration of a logic module constituting a variable function information processor according to a second embodiment of the present invention.

FIG. 5 is a diagram showing an example of the configuration of the logic module in the second embodiment.

In FIG. 5, a switching circuit 11a selects whether or not to output a signal Sa inputted from an input terminal A, and a switching circuit 11b selects whether or not to output an output signal of an inverter 16. The switching circuits 11a and 11b are designed such that either of them selectively becomes ON according to a signal Sd inputted from an input terminal D to transmit the signal Sa or the output signal of the inverter 16 to a two-input exclusive-NOR circuit 14 as one input signal. The other input signal of the two-input exclusive-NOR circuit 14 is a signal Se inputted from an input terminal E. An output signal of the two-input exclusive-NOR circuit 14 is inputted to the inverter 16 as an input signal.

A switching circuit 12a selects whether or not to output an output signal of an inverter 17, and a switching circuit 12b selects whether or not to output the output signal of the two-input exclusive-NOR circuit 14. The switching circuits 12a and 12b are designed to selectively become ON according to a signal Sf inputted from an input terminal F and transmit the output signal of the inverter 17 or the output signal of the two-input exclusive-NOR circuit 14 to a two-input exclusive-OR circuit 19 as one input signal. The other input signal of the two-input exclusive-OR circuit 19 is a signal Sg inputted from an input terminal G. An output signal of the two-input exclusive-OR circuit 19 is inputted to the inverter 17 as an input signal.

Further, an output terminal of the inverter 17 and an output terminal X of a logic module 10 are connected to each other, and the output signal of the inverter 17 is outputted as an output signal Sx of the logic module 10. Furthermore, the output signal of the two-input exclusive-NOR circuit 14 is supplied to switching circuits 13a and 13b respectively. The switching circuits 13a and 13b are controlled by the output signal of the two-input exclusive-NOR circuit 14 so that a signal Sb inputted from an input terminal B or a signal Sc inputted from an input terminal C is selectively transmitted to an output terminal Y. Thus, the signal Sb or Sc transmitted selectively is outputted as an output signal Sy of the logic module 10 from the output terminal Y.

In FIG. 5, a logic high is applied to the switching circuits 11a and 11b from the input terminal D and a logic low is applied to the switching circuits 12a and 12b from the input terminal F so that the switching circuits 11a and 12b become ON and that the switching circuits 11b and 12a become OFF. Moreover, an input signal Ia is inputted from the input terminal A, an input signal Ib is inputted from each of the input terminals B and E, and similarly, an input signal Ic is inputted from each of the input terminals C and G. On this occasion, a sum and a carry of the input signals Ia, Ib, and Ic are outputted respectively as the output signals Sx and Sy from the output terminals X and Y. Namely, the logic module 10 operates as a full adding circuit of a combinational logic circuit.

Moreover, in FIG. 5, a logic low is applied from the input terminal E to the two-input exclusive-NOR circuit 14 and a logic high is applied from the input terminal G to the two-input exclusive-OR circuit 19 so that the two-input exclusive-NOR circuit 14 and the two-input exclusive-OR circuit 19 substantially operate as inverters, and clock signals are inputted from the input terminals D and F to the switching circuits 11a and 11b, and 12a and 12b. On this occasion, the input signal Ia inputted from the input terminal A is delayed in synchronization with the clock signals and outputted as the output signal Sx from the output terminal X. In other words, the logic module 10 operates as a delay circuit (D-type flip-flop) of a sequential circuit. Incidentally, when the logic module 10 is operated as the delay circuit of the sequential circuit, input signals inputted from the input terminals B and C are optional.

The cases where the logic module shown in FIG. 5 operates as a full adding circuit (full adder) and operates as a delay circuit (D-type flip-flop) are explained above, but operations by the logic module shown in FIG. 5 are not limited to the aforementioned two operations. It is needless to say that in the logic module in the second embodiment of the present invention, by inputting predetermined input signals from the input terminals A to G, various kinds of combinational logic circuits including a selector circuit which selects any one of inputted input signals and outputs it, for example, can be realized.

Figure 6:
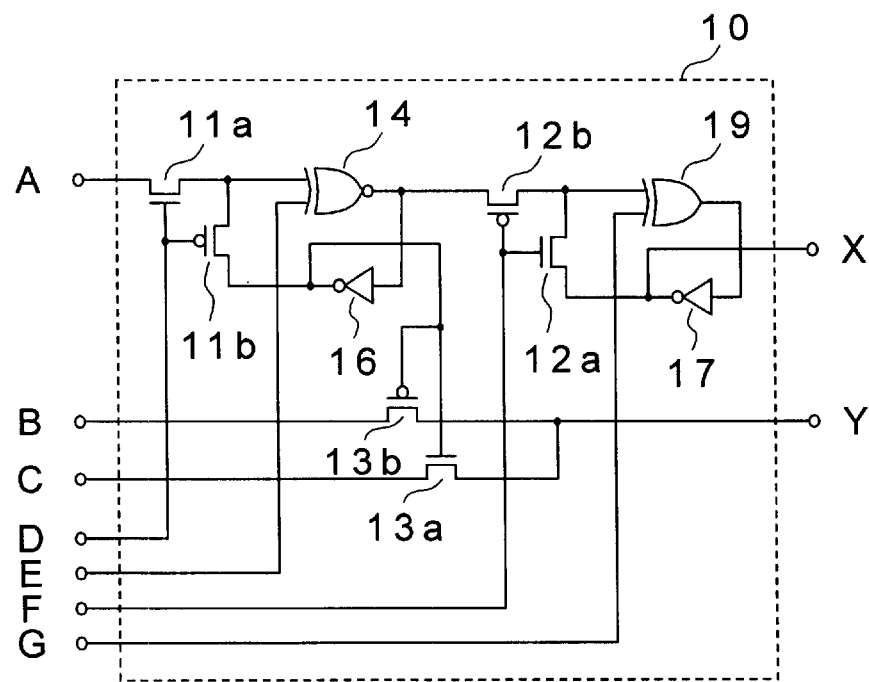
FIG. 6 is a diagram showing another example of the configuration of the logic module constituting the variable function information processor according to the second embodiment of the present invention.
Figure 7:
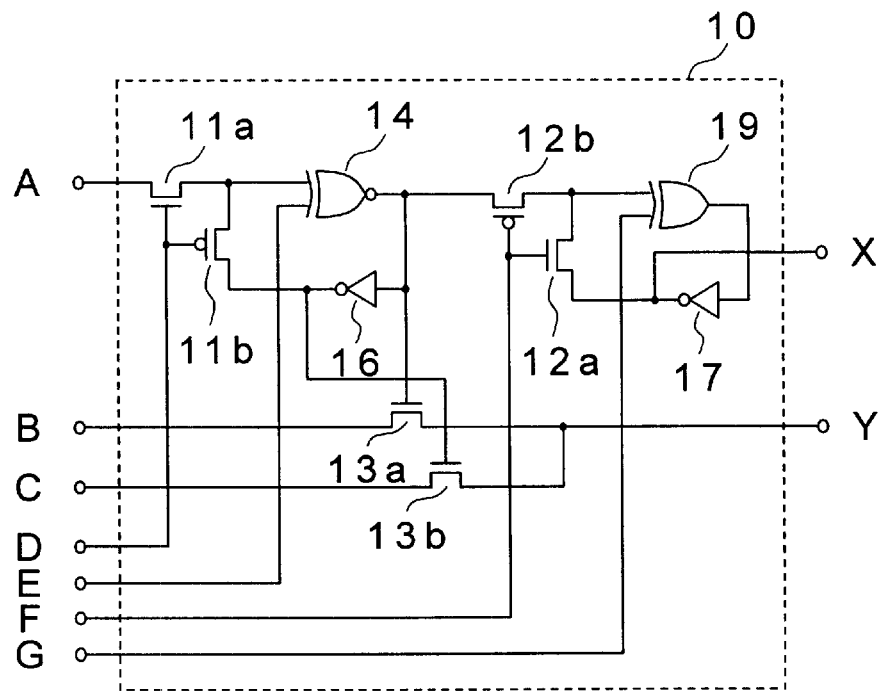
FIG. 7 is a diagram showing still another example of the configuration of the logic module constituting the variable function information processor according to the second embodiment of the present invention.
Figure 8:
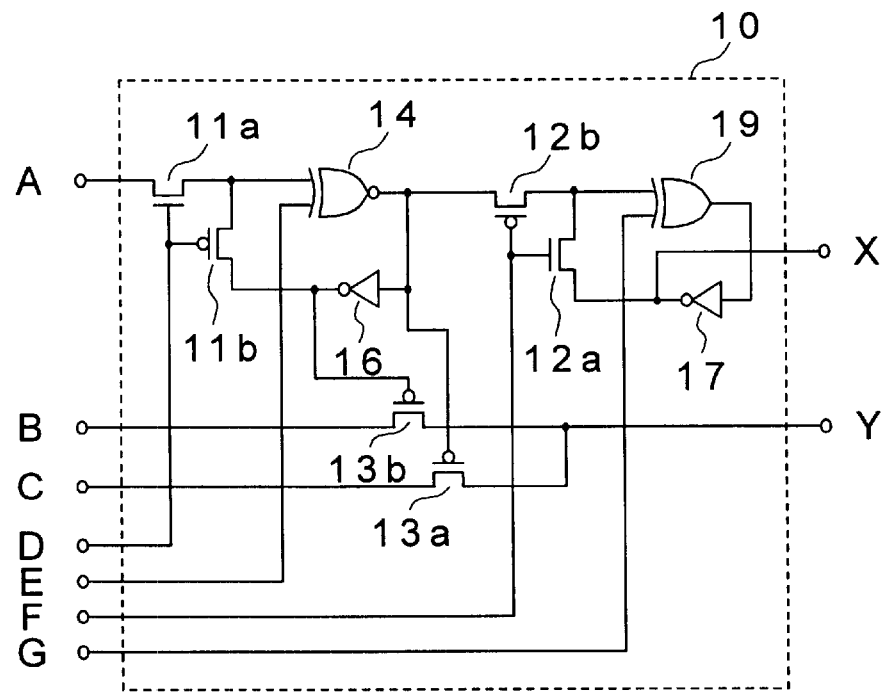
FIG. 8 is a diagram showing yet another example of the configuration of the logic module constituting the variable function information processor according to the second embodiment of the present invention.

FIG. 6 to FIG. 8 are diagrams showing other examples of the configuration of the logic module in the second embodiment.

The logic module 10 shown in each of FIG. 6 to FIG. 8 and the logic module 10 shown in FIG. 5 are different in a signal for controlling the switching circuits 13a and 13b for selectively transmitting the signals Sb and Sc inputted respectively from the input terminals B and C to the output terminal Y, and the configurations of the logic modules 10 shown in FIG. 6 to FIG. 8 and the configuration of the logic module 10 shown in FIG. 5 are different from each other. The signal for controlling the switching circuits 13a and 13b is the output signal of the inverter 16 in the logic module 10 shown in FIG. 6, but both the output signal of the two-input exclusive-NOR circuit 14 and the output signal of the inverter 16 in the logic module 10 shown in each of FIG. 7 and FIG. 8. Moreover, with the difference between the signals for controlling the switching circuits 13a and 13b, logic values (a logic high, a logic low) at which the switching circuits 13a and 13b operate also differ according to supplied signals.

It should be mentioned that the operations of the logic modules 10 shown in FIG. 6 to FIG. 8 are the same as that of the logic module shown in FIG. 5.

As explained above, according to the second embodiment, by configuring the logic module 10 as shown in each of FIG. 5 to FIG. 8, both the full adding circuit which is the combinational logic circuit and the delay circuit which is the sequential circuit can be realized by the same logic module 10. Further, by using a common part of a semiconductor circuit element group constituting the full adding circuit and the delay circuit respectively for both the circuits, the number of transistors constituting the logic module 10 can be effectively decreased.

Figure 34A:
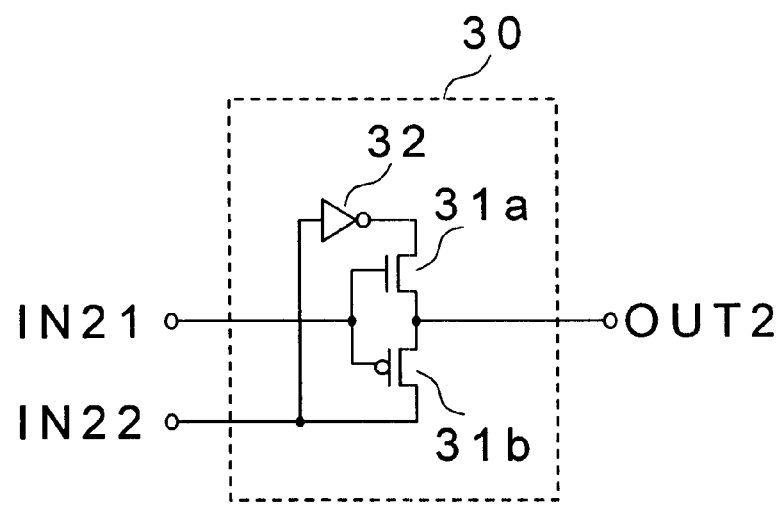
FIG. 34A and FIG. 34B are diagrams each showing an example of a configuration of a two-input exclusive-OR circuit.
Figure 34B:
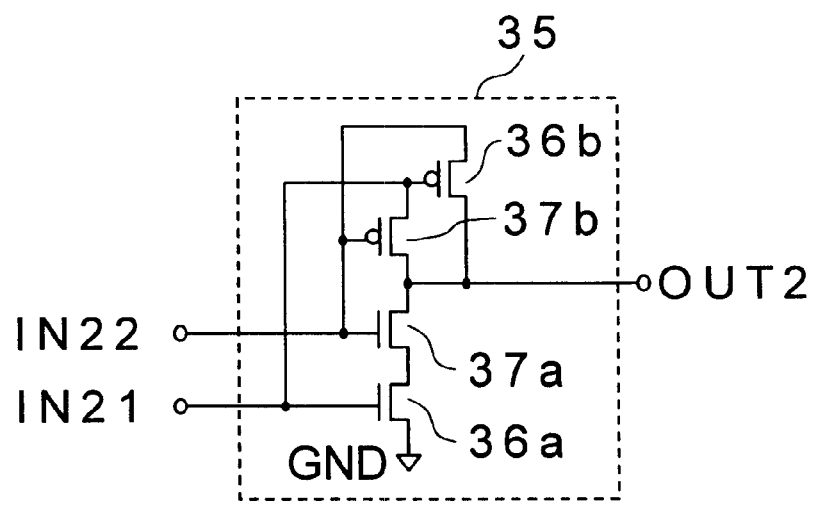

In this case, the two-input exclusive-NOR circuits 14 shown in FIG. 5 to FIG, 8 can be structured, for example, by circuits shown in FIG. 33A and FIG. 33B, and the two-input exclusive-OR circuits 19 can be structured, for example, by circuits shown in FIG. 34A and FIG. 34B. FIG. 34A and FIG. 34B are diagrams each showing an example of the two-input exclusive-OR circuit. Incidentally, the configurations and operations of the two-input exclusive-OR circuits shown in FIG. 34A and FIG. 34B will be described later.

By using such a circuit as shown in FIG. 33A or FIG. 33B, the two-input exclusive-NOR circuit 14 can be composed of four transistors, and by using such a circuit as shown in FIG. 34A or FIG. 34B, the two-input exclusive-OR circuit 19 can be composed of four transistors, whereby the number of transistors composing the logic module 10 can be effectively decreased.

In the logic module 10 in the second embodiment shown in each of FIG. 5 to FIG. 8, the number of transistors necessary to constitute the logic module 10 is 18, and consequently a function almost equal to that in the aforementioned conventional example can be realized by the number of transistors not more than a half of 42 which is the number of transistors necessary in the aforementioned conventional example.

Third Embodiment

Next, regarding a logic module constituting a variable function information processor according to the third embodiment of the present invention, its configuration and operation will be explained.

Figure 9:
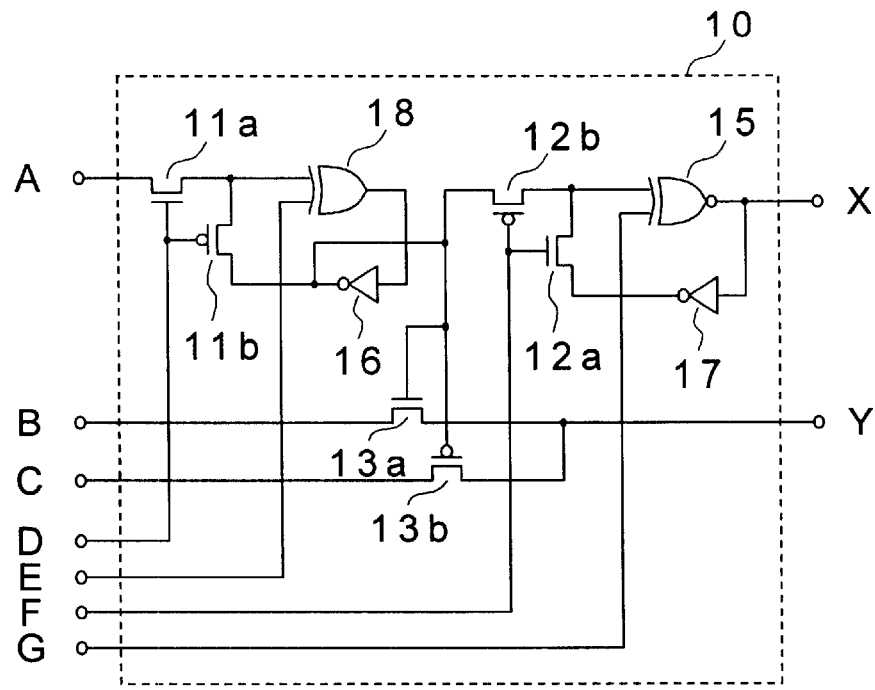
FIG. 9 is a diagram showing an example of a configuration of a logic module constituting a variable function information processor according to a third embodiment of the present invention.

FIG. 9 is a diagram showing an example of the configuration of the logic module in the third embodiment.

In FIG. 9, a switching circuit 11a selects whether or not to output a signal Sa inputted from an input terminal A, and a switching circuit 11b selects whether or not to output an output signal of an inverter 16. The switching circuits 11a and 11b are designed such that either of them selectively becomes ON according to a signal Sd inputted from an input terminal D to transmit the signal Sa or the output signal of the inverter 16 to a two-input exclusive-OR circuit 18 as one input signal. The other input signal of the two-input exclusive-OR circuit 18 is a signal Se inputted from an input terminal E. An output signal of the two-input exclusive-OR circuit 18 is inputted as an input signal to the inverter 16.

A switching circuit 12a selects whether or not to output an output signal of an inverter 17, and a switching circuit 12b selects whether or not to output the output signal of the inverter 16. The switching circuits 12a and 12b are designed to selectively become ON according to a signal Sf inputted from an input terminal F to transmit the output signal of the inverter 17 or the output signal of the inverter 16 to a two-input exclusive-NOR circuit 15 as one input signal. The other input signal of the two-input exclusive-NOR circuit 15 is a signal Sg inputted from an input terminal G. An output signal of the two-input exclusive-NOR circuit 15 is inputted to the inverter 17 as an input signal.

Further, an output terminal of the two-input exclusive-NOR circuit 15 and an output terminal X of a logic module 10 are connected to each other, and the output signal of the two-input exclusive-NOR circuit 15 is outputted as an output signal Sx of the logic module 10. Furthermore, the output signal of the inverter 16 is supplied to switching circuits 13a and 13b respectively. The switching circuits 13a and 13b are controlled by the output signal of the inverter 16 so that a signal Sb inputted from an input terminal B or a signal Sc inputted from an input terminal C is selectively transmitted to an output terminal Y. Thus, the signal Sb or Sc transmitted selectively is outputted as an output signal Sy of the logic module 10 from the output terminal Y.

In FIG. 9, a logic high is applied to the switching circuits 11a and 11b from the input terminal D and a logic low is applied to the switching circuits 12a and 12b from the input terminal F so that the switching circuits 11a and 12b become ON and that the switching circuits 11b and 12a become OFF. Moreover, an input signal Ia is inputted from the input terminal A, an input signal Ib is inputted from each of the input-terminals B and E, and similarly, an input signal Ic is inputted from each of the input terminals C and G. On this occasion, a sum and a carry of the input signals Ia, Ib, and Ic are outputted respectively as the output signals Sx and Sy from the output terminals X and Y. Namely, the logic module 10 operates as a full adding circuit of a combinational logic circuit.

Moreover, in FIG. 9, a logic high is applied from the input terminal E to the two-input exclusive-OR circuit 18 and a logic low is applied from the input terminal G to the two-input exclusive-NOR circuit 15 so that the two-input exclusive-OR circuit 18 and the two-input exclusive-NOR circuit 15 substantially operate as inverters, and clock signals are inputted from the input terminals D and F to the switching circuits 11a and 11b, and 12a and 12b. On this occasion, the input signal Ia inputted from the input terminal A is delayed in synchronization with the clock signals and outputted as the output signal Sx from the output terminal X. In other words, the logic module 10 operates as a delay circuit (D-type flip-flop) of a sequential circuit. Incidentally, when the logic module 10 is operated as the delay circuit of the sequential circuit, input signals inputted from the input terminals B and C are optional.

The cases where the logic module shown in FIG. 9 operates as a full adding circuit (full adder) and operates as a delay circuit (D-type flip-flop) are explained above, but operations by the logic module shown in FIG. 9 are not limited to the aforementioned two operations. It is needless to say that in the logic module in the third embodiment of the present invention, by inputting predetermined input signals from the input terminals A to G, various kinds of combinational logic circuits including a selector circuit which selects any one of inputted input signals and outputs it, for example, can be realized.

Figure 10:
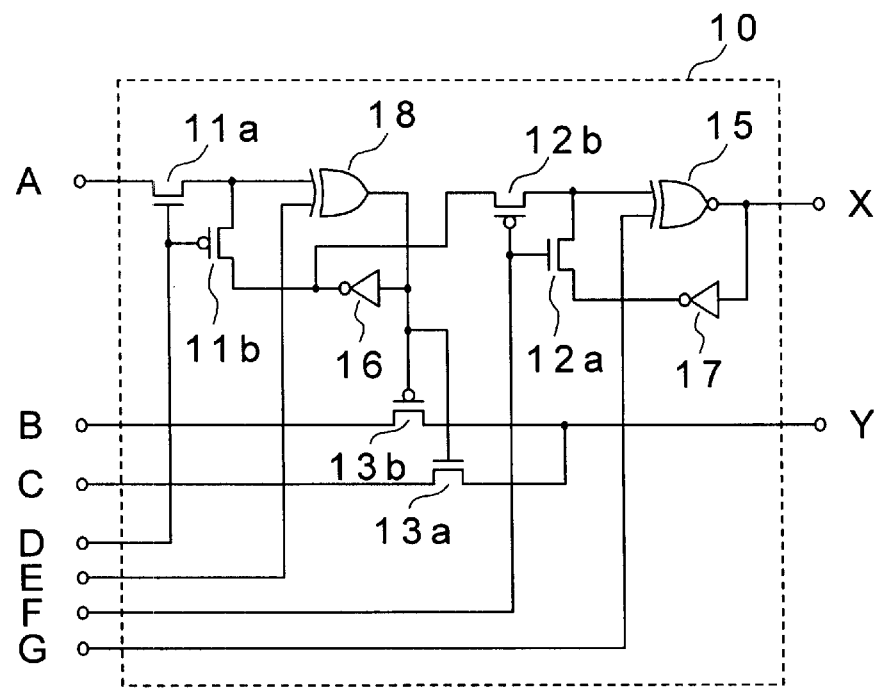
FIG. 10 is a diagram showing another example of the configuration of the logic module constituting the variable function information processor according to the third embodiment of the present invention.
Figure 11:
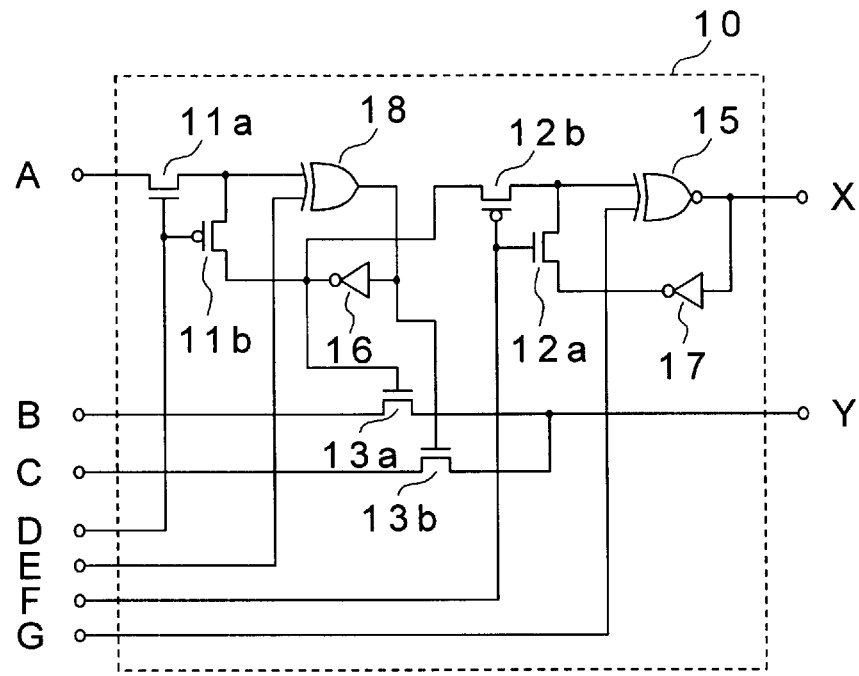
FIG. 11 is a diagram showing still another example of the configuration of the logic module constituting the variable function information processor according to the third embodiment of the present invention.
Figure 12:
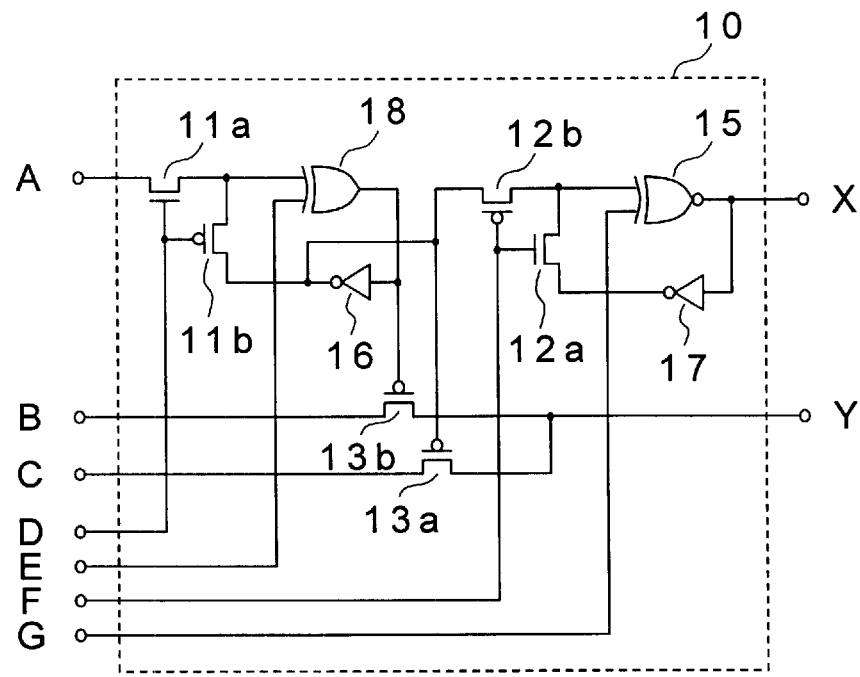
FIG. 12 is a diagram showing yet another example of the configuration of the logic module constituting the variable function information processor according to the third embodiment of the present invention.

FIG. 10 to FIG. 12 are diagrams showing other examples of the configuration of the logic module in the third embodiment.

The logic module 10 shown in each of FIG. 10 to FIG. 12 and the logic module 10 shown in FIG. 9 are different in a signal for controlling the switching circuits 13a and 13b for selectively transmitting the signals Sb and Sc inputted respectively from the input terminals B and C to the output terminal Y, and the configuration of the logic module 10 shown in each of FIG. 10 to FIG. 12 and the configuration of the logic module 10 shown in FIG. 9 are different from each other. The signal for controlling the switching circuits 13a and 13b is the output signal of the two-input exclusive-OR circuit 18 in the logic module 10 shown in FIG. 10, but both the output signal of the two-input exclusive-OR circuit 18 and the output signal of the inverter 16 in the logic module 10 shown in each of FIG. 11 and FIG. 12. Moreover, with the difference between the signals for controlling the switching circuits 13a and 13b, logic values (a logic high, a logic low) at which the switching circuits 13a and 13b operate also differ according to supplied signals.

It should be mentioned that the operations of the logic modules 10 shown in FIG. 10 to FIG. 12 are the same as that of the logic module shown in FIG. 9.

As explained above, according to the third embodiment, by configuring the logic module 10 as shown in each of FIG. 9 to FIG. 12, both the full adding circuit which is the combinational logic circuit and the delay circuit which is the sequential circuit can be realized by the same logic module 10. Further, by using a common part of a semiconductor circuit element group constituting the full adding circuit and the delay circuit respectively for both the circuits, the number of transistors constituting the logic module 10 can be effectively decreased.

In this case, the two-input exclusive-NOR circuits 15 shown in FIG. 9 to FIG. 12 can be structured, for example, by circuits shown in FIG. 33A and FIG. 33B, and the two-input exclusive-OR circuits 18 can be structured, for example, by circuits shown in FIG. 34A and FIG. 34B. Thereby, it becomes possible that the two-input exclusive-NOR circuit 15 and the two-input exclusive-OR circuit 18 are each composed of four transistors, whereby the number of transistors composing the logic module 10 can be effectively decreased.

In the logic module 10 in the third embodiment shown in each of FIG. 9 to FIG. 12, the number of transistors necessary to constitute the logic module 10 is 18, and consequently a function almost equal to that in the aforementioned conventional example can be realized by the number of transistors not more than a half of 42 which is the number of transistors necessary in the aforementioned conventional example.

Fourth Embodiment

Next, regarding a logic module constituting a variable function information processor according to the fourth embodiment of the present invention, its configuration and operation will be explained.

Figure 13:
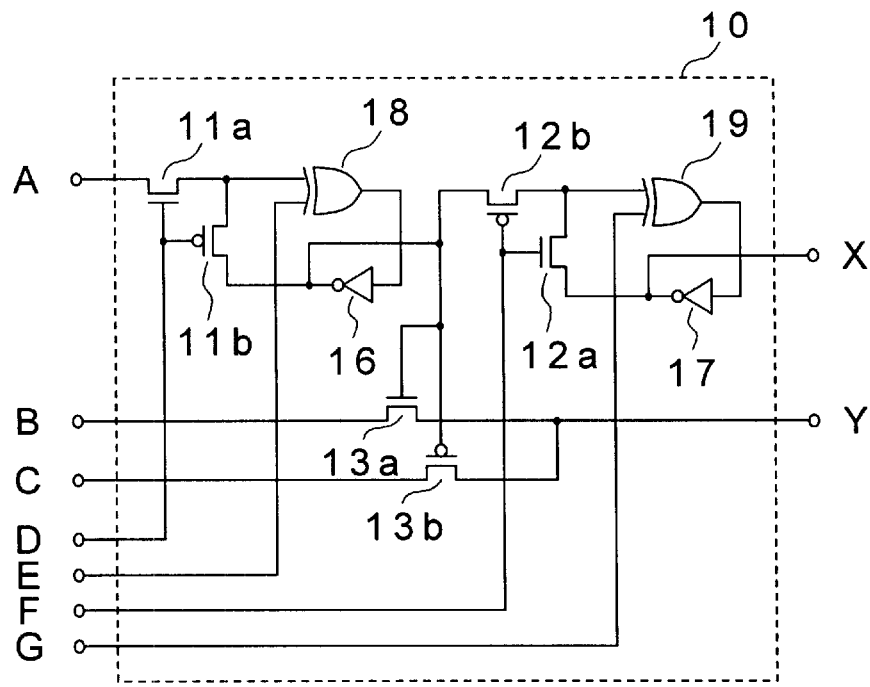
FIG. 13 is a diagram showing an example of a configuration of a logic module constituting a variable function information processor according to a fourth embodiment of the present invention.

FIG. 13 is a diagram showing an example of the configuration of the logic module in the fourth embodiment.

In FIG. 13, a switching circuit 11a selects whether or not to output a signal Sa inputted from an input terminal A, and a switching circuit 11b selects whether or not to output an output signal of an inverter 16. The switching circuits 11a and 11b are designed such that either of them selectively becomes ON according to a signal Sd inputted from an input terminal D to transmit the signal Sa or the output signal of the inverter 16 to a two-input exclusive-OR circuit 18 as one input signal. The other input signal of the two-input exclusive-OR circuit 18 is a signal Se inputted from an input terminal E. An output signal of the two-input exclusive-OR circuit 18 is inputted to the inverter 16 as an input signal.

A switching circuit 12a selects whether or not to output an output signal of an inverter 17, and a switching circuit 12b selects whether or not to output the output signal of the inverter 16. The switching circuits 12a and 12b are designed to selectively become ON according to a signal Sf inputted from an input terminal F to transmit the output signal of the inverter 17 or the output signal of the inverter 16 to a two-input exclusive-OR circuit 19 as one input signal. The other input signal of the two-input exclusive-OR circuit 19 is a signal Sg inputted from an input terminal G. An output signal of the two-input exclusive-OR circuit 19 is inputted to the inverter 17 as an input signal.

Further, an output terminal of the inverter 17 and an output terminal X of a logic module 10 are connected to each other, and the output signal of the inverter 17 is outputted as an output signal Sx of the logic module 10. Furthermore, the output signal of the inverter 16 is supplied to switching circuits 13a and 13b respectively. The switching circuits 13a and 13b are controlled by the output signal of the inverter 16 so that a signal Sb inputted from an input terminal B or a signal Sc inputted from an input terminal C is selectively transmitted to an output terminal Y. Thus, the signal Sb or Sc transmitted selectively is outputted as an output signal Sy of the logic module 10 from the output terminal Y.

In FIG. 13, a logic high is applied to the switching circuits 11a and 11b from the input terminal D and a logic low is applied to the switching circuits 12a and 12b from the input terminal F so that the switching circuits 11a and 12b become ON and that the switching circuits 11b and 12a become OFF. Moreover, an input signal Ia is inputted from the input terminal A, an input signal Ib is inputted from each of the input terminals B and E, and similarly, an input signal Ic is inputted from each of the input terminals C and G. On this occasion, a sum and a carry of the input signals Ia, Ib, and Ic are outputted respectively as the output signals Sx and Sy from the output terminals X and Y. Namely, the logic module 10 operates as a full adding circuit of a combinational logic circuit.

Moreover, in FIG. 13, logic highs are applied from the input terminals E and G to the two-input exclusive-OR circuits 18 and 19 so that the two-input exclusive-OR circuits 18 and 19 substantially operate as inverters, and clock signals are inputted from the input terminals D and F to the switching circuits 11a and 11b, and 12a and 12b. On this occasion, the input signal Ia inputted from the input terminal A is delayed in synchronization with the clock signals and outputted as the output signal Sx from the output terminal X. In other words, the logic module 10 operates as a delay circuit (D-type flip-flop) of a sequential circuit. Incidentally, when the logic module 10 is operated as the delay circuit of the sequential circuit, input signals inputted from the input terminals B and C are optional.

The cases where the logic module shown in FIG. 13 operates as the full adding circuit (full adder) and operates as the delay circuit (D-type flip-flop) are explained above, but operations by the logic module shown in FIG. 13 are not limited to the aforementioned two operations. It is needless to say that in the logic module in the fourth embodiment of the present invention, by inputting predetermined input signals from the input terminals A to G, various kinds of combinational logic circuits including a selector circuit which selects any one of inputted input signals and outputs it, for example, can be realized.

Figure 14:
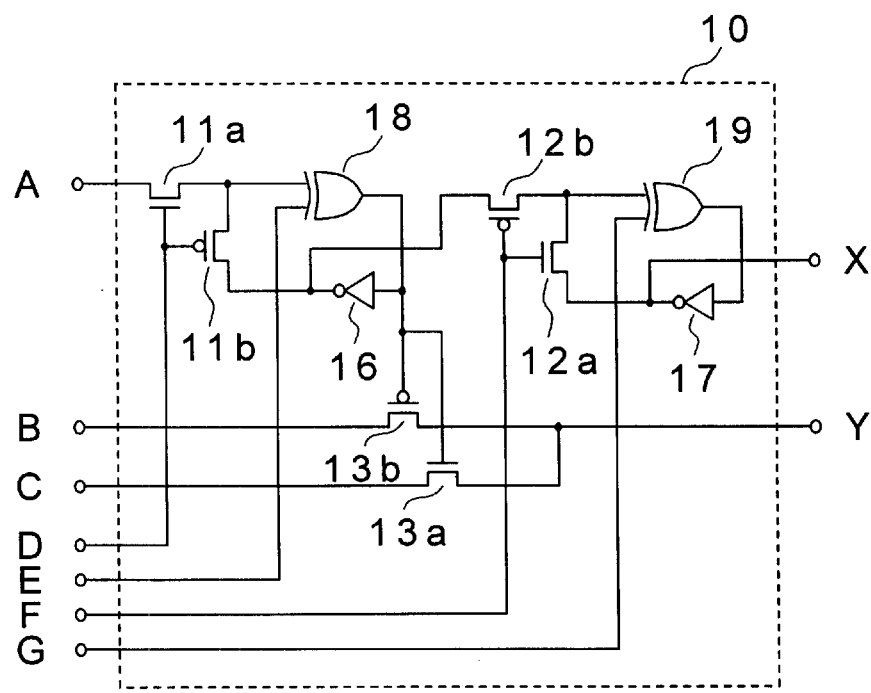
FIG. 14 is a diagram showing another example of the configuration of the logic module constituting the variable function information processor according to the fourth embodiment of the present invention.
Figure 15:
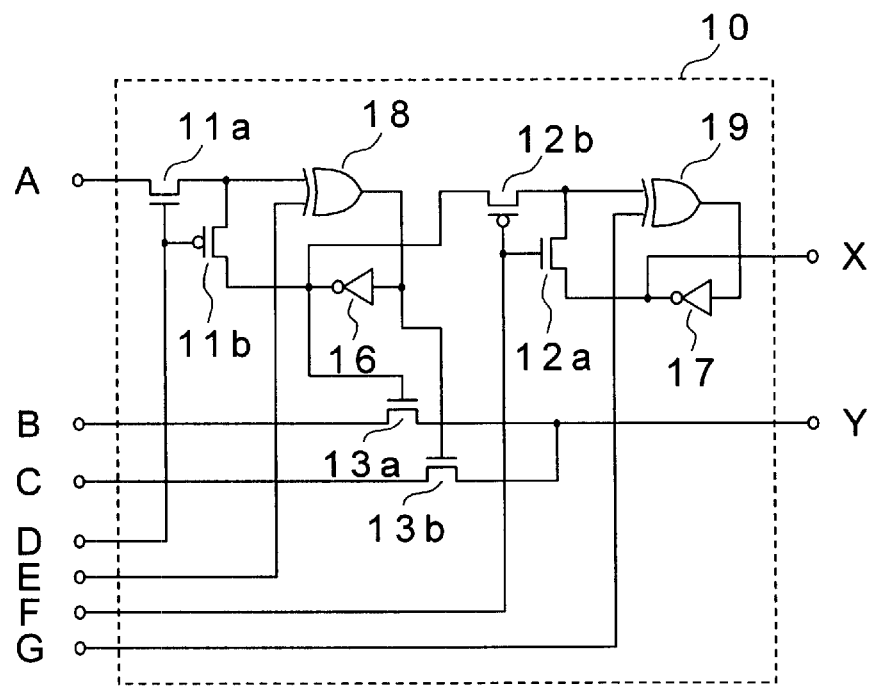
FIG. 15 is a diagram showing still another example of the configuration of the logic module constituting the variable function information processor according to the fourth embodiment of the present invention.
Figure 16:
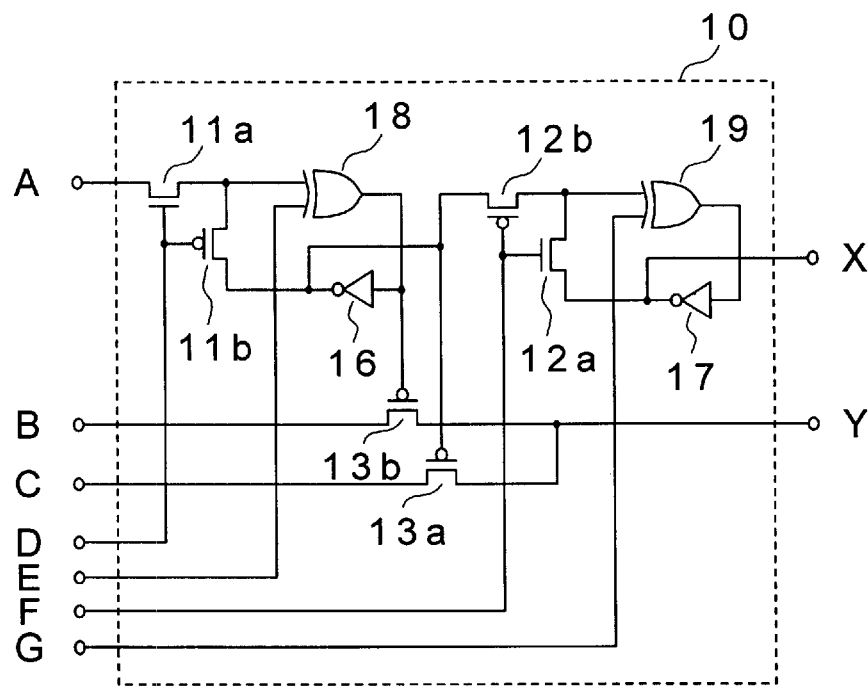
FIG. 16 is a diagram showing yet another example of the configuration of the logic module constituting the variable function information processor according to the fourth embodiment of the present invention.

FIG. 14 to FIG. 16 are diagrams showing other examples of the configuration of the logic module in the fourth embodiment.

The logic module 10 shown in each of FIG. 14 to FIG. 16 and the logic module 10 shown in FIG. 13 are different in a signal for controlling the switching circuits 13a and 13b for selectively transmitting the signals Sb and Sc inputted respectively from the input terminals B and C to the output terminal Y, and the configuration of the logic module 10 shown in each of FIG. 14 to FIG. 16 and the configuration of the logic module 10 shown in FIG. 13 are different from each other. The signal for controlling the switching circuits 13a and 13b is the output signal of the two-input exclusive-OR circuit 18 in the logic module 10 shown in FIG. 14, both the output signal of the two-input exclusive-OR circuit 18 and the output signal of the inverter 16 in the logic module 10 shown in each of FIG. 15 and FIG. 16. Moreover, with the difference between the signals for controlling the switching circuits 13a and 13b, logic values (a logic high, a logic low) at which the switching circuits 13a and 13b operate also differ according to supplied signals.

It should be mentioned that the operations of the logic modules 10 shown in FIG. 14 to FIG. 16 are the same as that of the logic module shown in FIG. 13.

As explained above, according to the fourth embodiment, by configuring the logic module 10 as shown in each of FIG. 13 to FIG. 16, both the full adding circuit which is the combinational logic circuit and the delay circuit which is the sequential circuit can be realized by the same logic module 10. Further, by using a common part of a semiconductor circuit element group constituting the full adding circuit and the delay circuit respectively for both the circuits, the number of transistors constituting the logic module 10 can be effectively decreased.

In this case, the two-input exclusive-OR circuits 18 and 19 shown in FIG. 13 to FIG. 16 can be structured, for example, by circuits shown in FIG. 34A and FIG. 34B. Thereby, it becomes possible that the two-input exclusive-OR circuits 18 and 19 are each composed of four transistors, whereby the number of transistors composing the logic module 10 can be effectively decreased.

In the logic module 10 in the fourth embodiment shown in each of FIG. 13 to FIG. 16, the number of transistors necessary to constitute the logic module 10 is 18, and consequently a function almost equal to that in the aforementioned conventional example can be realized by the number of transistors not more than a half of 42 which is the number of transistors necessary in the aforementioned conventional example.

Fifth Embodiment

Next, regarding a logic module constituting a variable function information processor according to the fifth embodiment of the present invention, its configuration and operation will be explained.

Figure 17:
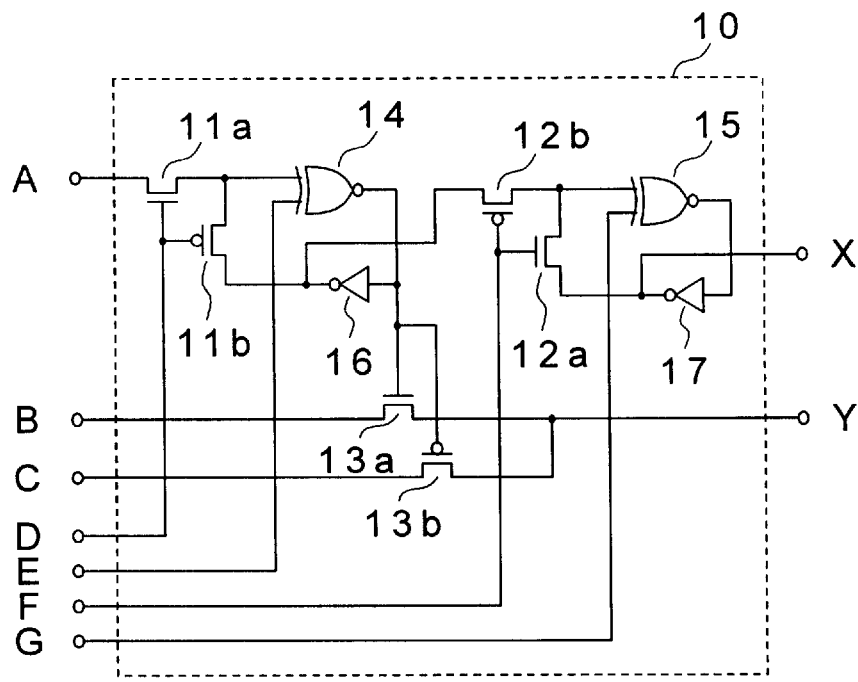
FIG. 17 is a diagram showing an example of a configuration of a logic module constituting a variable function information processor according to a fifth embodiment of the present invention.

FIG. 17 is a diagram showing an example of the configuration of the logic module in the fifth embodiment.

In FIG. 17, a switching circuit 11a selects whether or not to output a signal Sa inputted from an input terminal A, and a switching circuit 11b selects whether or not to output an output signal of an inverter 16. The switching circuits 11a and 11b are designed such that either one of them selectively becomes ON according to a signal Sd inputted from an input terminal D to transmit the signal Sa or the output signal of the inverter 16 to a two-input exclusive-NOR circuit 14 as one input signal. The other input signal of the two-input exclusive-NOR circuit 14 is a signal Se inputted from an input terminal E. An output signal of the two-input exclusive-NOR circuit 14 is inputted to the inverter 16 as an input signal.

A switching circuit 12a selects whether or not to output an output signal of an inverter 17, and a switching circuit 12b selects whether or not to output the output signal of the inverter 16. The switching circuits 12a and 12b are designed to selectively become ON according to a signal Sf inputted from an input terminal F to transmit the output signal of the inverter 17 or the output signal of the inverter 16 to a two-input exclusive-NOR circuit 15 as one input signal. The other input signal of the two-input exclusive-NOR circuit 15 is a signal Sg inputted from an input terminal G. An output signal of the two-input exclusive-NOR circuit 15 is inputted to the inverter 17 as an input signal.

Further, an output terminal of the inverter 17 and an output terminal X of a logic module 10 are connected to each other, and the output signal of the inverter 17 is outputted as an output signal Sx of the logic module 10. Furthermore, the output signal of the two-input exclusive-NOR circuit 14 is supplied to switching circuits 13a and 13b respectively. The switching-circuits 13a and 13b are-controlled by the output signal of the two-input exclusive-NOR circuit 14 so that a signal Sb inputted from an input terminal B or a signal Sc inputted from an input terminal C is selectively transmitted to an output terminal Y. Thus, the signal Sb or Sc transmitted selectively is outputted as an output signal Sy of the logic module 10 from the output terminal Y.

In FIG. 17, a logic high is applied to the switching circuits 11a and 11b from the input terminal D and a logic low is applied to the switching circuits 12a and 12b from the input terminal F so that the switching circuits 11a and 12b become ON and that the switching circuits 11b and 12a become OFF. Moreover, an input signal Ia is inputted from the input terminal A, an input signal Ib is inputted from each of the input terminals B and E, and similarly, an input signal Ic is inputted from each of the input terminals C and G. On this occasion, a sum and a carry of the input signals Ia, Ib, and Ic are outputted respectively as the output signals Sx and Sy from the output terminals X and Y. Namely, the logic module 10 operates as a full adding circuit of a combinational logic circuit.

Moreover, in FIG. 17, logic lows are applied to the two-input exclusive-NOR circuits 14 and 15 from the input terminals E and G respectively so that the two-input exclusive-NOR circuits 14 and 15 substantially operate as inverters, and clock signals are inputted from the input terminals D and F to the switching circuits 11a and 11b, and 12a and 12b. On this occasion, the input signal Ia inputted from the input terminal A is delayed in synchronization with the clock signals and outputted as the output signal Sx from the output terminal X. In other words, the logic module 10 operates as a delay circuit (D-type flip-flop) of a sequential circuit. Incidentally, when the logic module 10 is operated as the delay circuit of the sequential circuit, input signals inputted from the input terminals B and C are optional.

The cases where the logic module shown in FIG. 17 operates as the full adding circuit (full adder) and operates as the delay circuit (D-type flip-flop) are explained above, but operations by the logic module shown in FIG. 17 are not limited to the aforementioned two operations. It is needless to say that in the logic module in the fifth embodiment of the present invention, by inputting predetermined input signals from the input terminals A to G, various kinds of combinational logic circuits including a selector circuit which selects any one of inputted input signals and outputs it, for example, can be realized.

Figure 18:
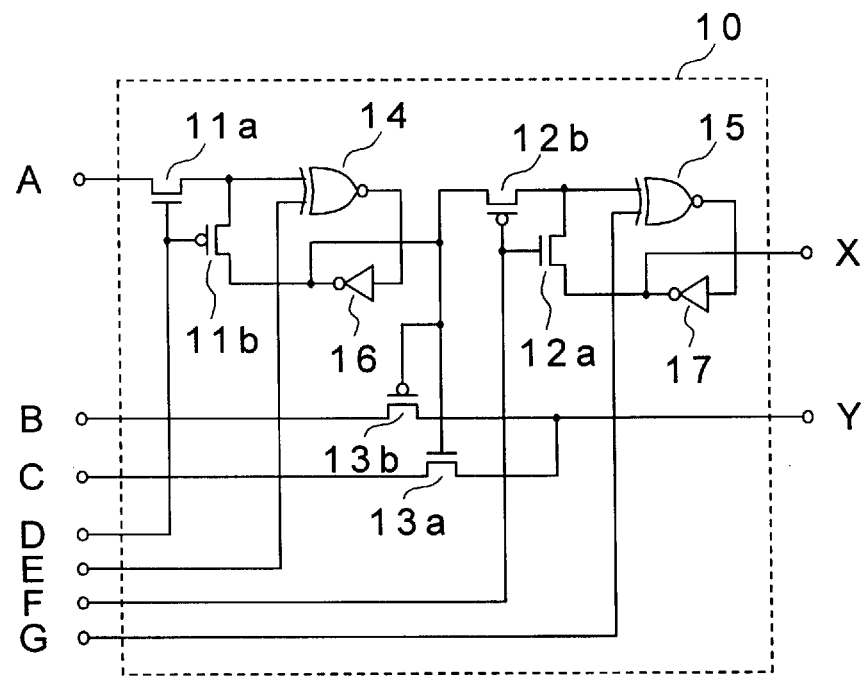
FIG. 18 is a diagram showing another example of the configuration of the logic module constituting the variable function information processor according to the fifth embodiment of the present invention.
Figure 19:
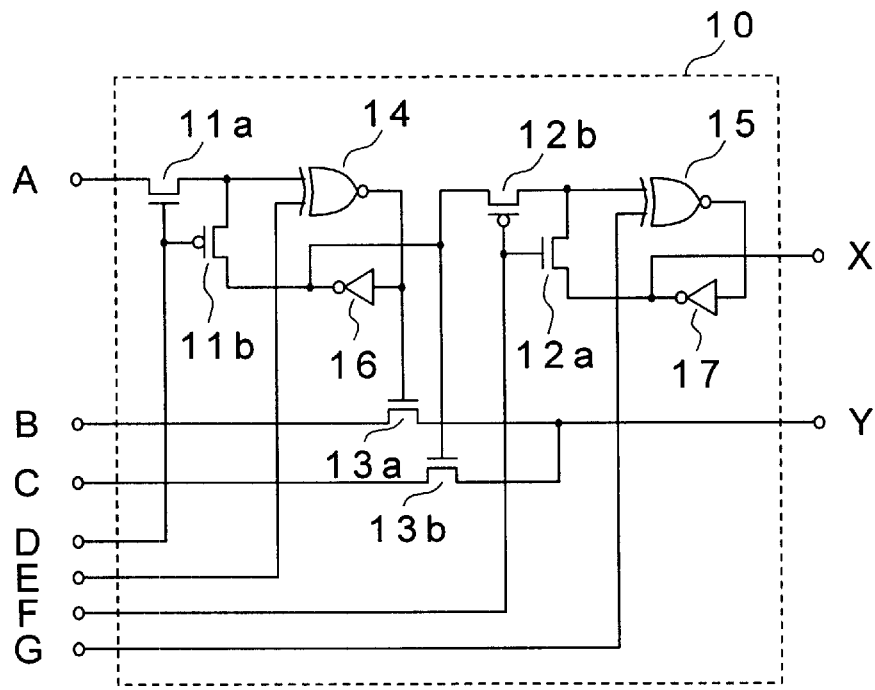
FIG. 19 is a diagram showing still another example of the configuration of the logic module constituting the variable function information processor according to the fifth embodiment of the present invention.
Figure 20:
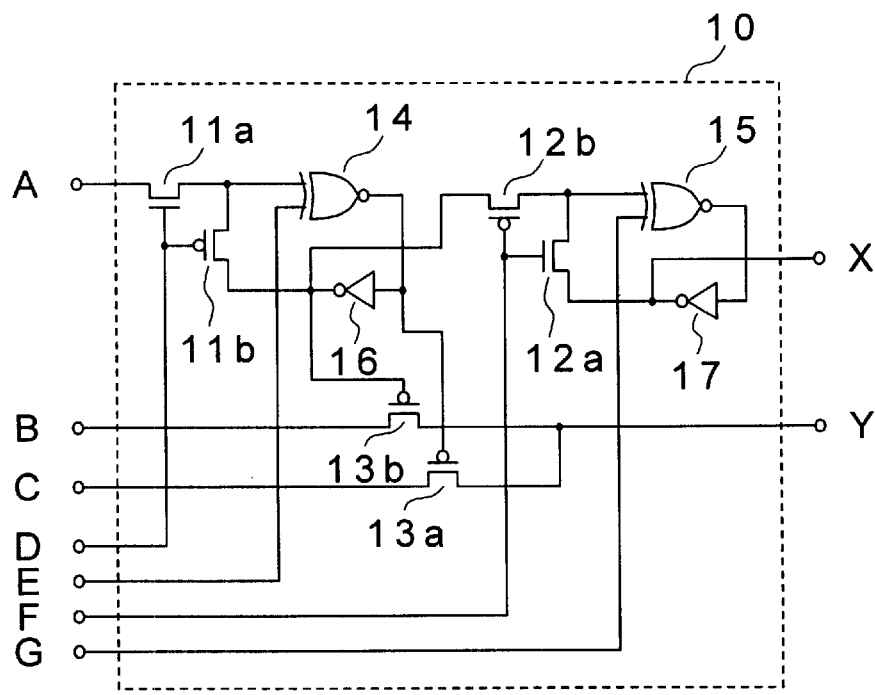
FIG. 20 is a diagram showing yet another example of the configuration of the logic module constituting the variable function information processor according to the fifth embodiment of the present invention.

FIG. 18 to FIG. 20 are diagrams showing other examples of the configuration of the logic module in the fifth embodiment.

The logic module 10 shown in each of FIG. 18 to FIG. 20 and the logic module 10 shown in FIG. 17 are different in a signal for controlling the switching circuits 13a and 13b for selectively transmitting the signals Sb and Sc inputted respectively from the input terminals B and C to the output terminal Y, and the configuration of the logic module 10 shown in each of FIG. 18 to FIG. 20 and the configuration of the logic module 10 shown in FIG. 17 are different from each other. The signal for controlling the switching circuits 13a and 13b is the output signal of the inverter 16 in the logic module 10 shown in FIG. 18, but both the output signal of the two-input exclusive-NOR circuit 14 and the output signal of the inverter 16 in the logic module 10 shown in each of FIG. 19 and FIG. 20. Moreover, with the difference between the signals for controlling the switching circuits 13a and 13b, logic values (a logic high, a logic low) at which the switching circuits 13a and 13b operate also differ according to supplied signals.

It should be mentioned that the operations of the logic modules 10 shown in FIG. 18 to FIG. 20 are the same as that of the logic module shown in FIG. 17.

As explained above, according to the fifth embodiment, by configuring the logic module 10 as shown in each of FIG. 17 to FIG. 20, both the full adding circuit which is the combinational logic circuit and the delay circuit which is the sequential circuit can be realized by the same logic module 10. Further, by using a common part of a semiconductor circuit element group constituting the full adding circuit and the delay circuit respectively for both the circuits, the number of transistors constituting the logic module 10 can be effectively decreased.

In this case, the two-input exclusive-NOR circuits 14 and 15 shown in FIG. 17 to FIG. 20 can be structured, for example, by circuits shown in FIG. 33A and FIG. 33B. Thereby, it becomes possible that the two-input exclusive-NOR circuits 14 and 15 are each composed of four transistors, whereby the number of transistors composing the logic module 10 can be effectively decreased.

In the logic module 10 in the fifth embodiment shown in each of FIG. 17 to FIG. 20, the number of transistors necessary to constitute the logic module 10 is 18, and consequently a function almost equal to that in the aforementioned conventional example can be realized by the number of transistors not more than a half of 42 which is the number of transistors necessary in the aforementioned conventional example.

Sixth Embodiment

Next, regarding a logic module constituting a variable function information processor according to the sixth embodiment of the present invention, its configuration and operation will be explained.

Figure 21:
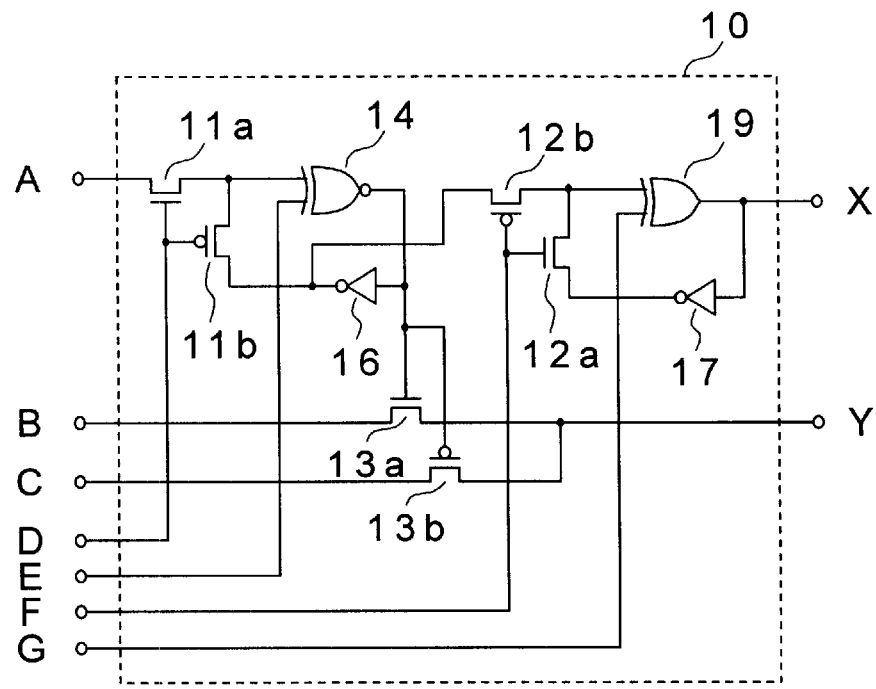
FIG. 21 is a diagram showing an example of a configuration of a logic module constituting a variable function information processor according to a sixth embodiment of the present invention.

FIG. 21 is a diagram showing an example of the configuration of the logic module in the sixth embodiment.

In FIG. 21, a switching circuit 11a selects whether or not to output a signal Sa inputted from an input terminal A, and a switching circuit 11b selects whether or not to output an output signal of an inverter 16. The switching circuits 11a and 11b are designed such that either of them selectively becomes ON according to a signal Sd inputted from an input terminal D to transmit the signal Sa or the output signal of the inverter 16 to a two-input exclusive-NOR circuit 14 as one input signal. The other input signal of the two-input exclusive-NOR circuit 14 is a signal Se inputted from an input terminal E. An output signal of the two-input exclusive-NOR circuit 14 is inputted to the inverter 16 as an input signal.

A switching circuit 12a selects whether or not to output an output signal of an inverter 17, and a switching circuit 12b selects whether or not to output the output signal of the inverter 16. The switching circuits 12a and 12b are designed to selectively become ON according to a signal Sf inputted from an input terminal F to transmit the output signal of the inverter 17 or the output signal of the inverter 16 to a two-input exclusive-OR circuit 19 as one input signal. The other input signal of the two-input exclusive-OR circuit 19 is a signal Sg inputted from an input terminal G. An output signal of the two-input exclusive-OR circuit 19 is inputted to the inverter 17 as an input signal.

Further, an output terminal of the two-input exclusive-OR circuit 19 and an output terminal X of a logic module 10 are-connected to each other, and the output signal of the two-input exclusive-OR circuit 19 is outputted as an output signal Sx of the logic module 10. Furthermore, the output signal of the two-input exclusive-NOR circuit 14 is supplied to switching circuits 13a and 13b respectively. The switching circuits 13a and 13b are controlled by the output signal of the two-input exclusive-NOR circuit 14 so that a signal Sb inputted from an input terminal B or a signal Sc inputted from an input terminal C is selectively transmitted to an output terminal Y. Thus, the signal Sb or Sc transmitted selectively is outputted as an output signal Sy of the logic module 10 from the output terminal Y.

In FIG. 21, a logic high is applied to the switching circuits 11a and 11b from the input terminal D and a logic low is applied to the switching circuits 12a and 12b from the input terminal F so that the switching circuits 11a and 12b become ON and that the switching circuits 11b and 12a become OFF. Moreover, an input signal Ia is inputted from the input terminal A, an input signal Ib is inputted from each of the input terminals B and E, and similarly, an input signal Ic is inputted from each of the input terminals C and G. On this occasion, a sum and a carry of the input signals Ia, Ib, and Ic are outputted respectively as the output signals Sx and Sy from the output terminals X and Y. Namely, the logic module 10 operates as a full adding circuit of a combinational logic circuit.

Moreover, in FIG. 21, a logic low is inputted to the two-input exclusive-NOR circuit 14 from the input terminal E, and a logic high is applied to the two-input exclusive-OR circuit 19 from the input terminal G so that the two-input exclusive-NOR circuit 14 and the two-input exclusive-OR circuit 19 substantially operate as inverters, and clock signals are inputted from the input terminals D and F to the switching circuits 11a and 11b, and 12a and 12b. On this occasion, the input signal Ia inputted from the input terminal A is delayed in synchronization with the clock signals and outputted as the output signal Sx from the output terminal X. In other words, the logic module 10 operates as a delay circuit (D-type flip-flop) of a sequential circuit. Incidentally, when the logic module 10 is operated as the delay circuit of the sequential circuit, input signals inputted from the input terminals B and C are optional.

The cases where the logic module shown in FIG. 21 operates as the full adding circuit (full adder) and operates as the delay circuit (D-type flip-flop) are explained above, but operations by the logic module shown in FIG. 21 are not limited to the aforementioned two operations. It is needless to say that in the logic module in the sixth embodiment of the present invention, by inputting predetermined input signals from the input terminals A to G, various kinds of combinational logic circuits including a selector circuit which selects any one of inputted input signals and outputs it, for example, can be realized.

Figure 22:
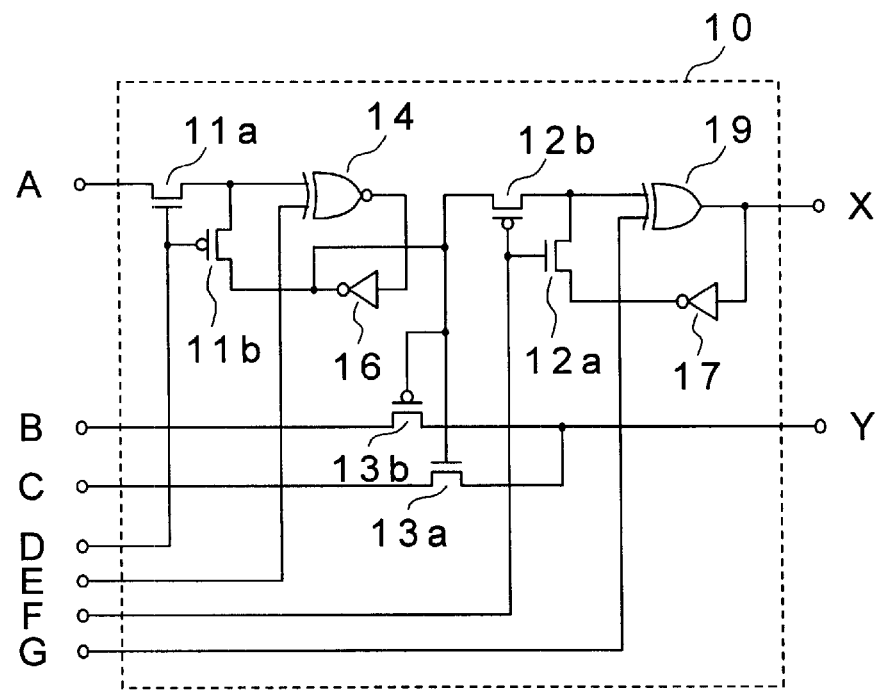
FIG. 22 is a diagram showing another example of the configuration of the logic module constituting the variable function information processor according to the sixth embodiment of the present invention.
Figure 23:
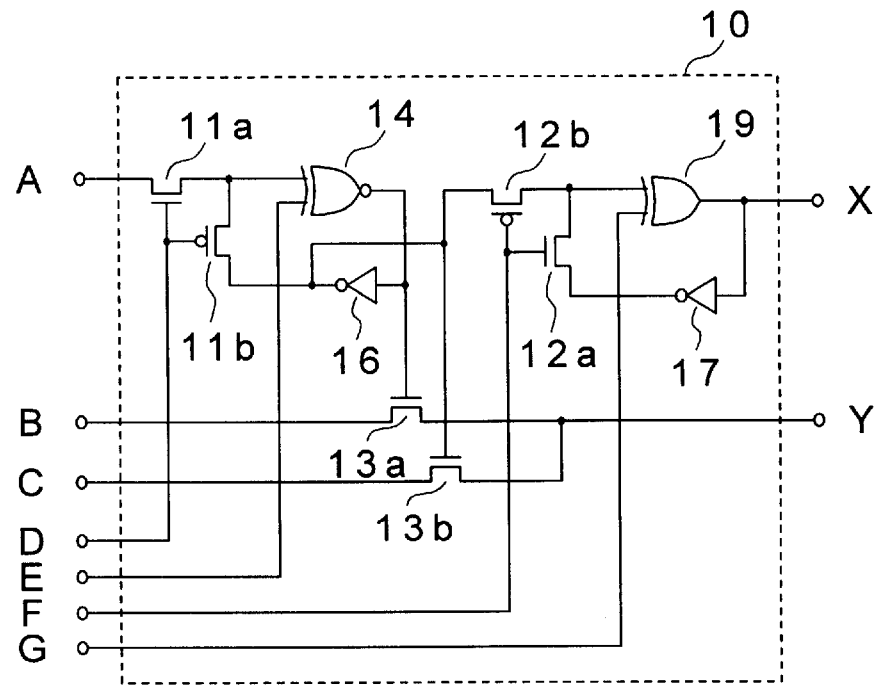
FIG. 23 is a diagram showing still another example of the configuration of the logic module constituting the variable function information processor according to the sixth embodiment of the present invention.
Figure 24:
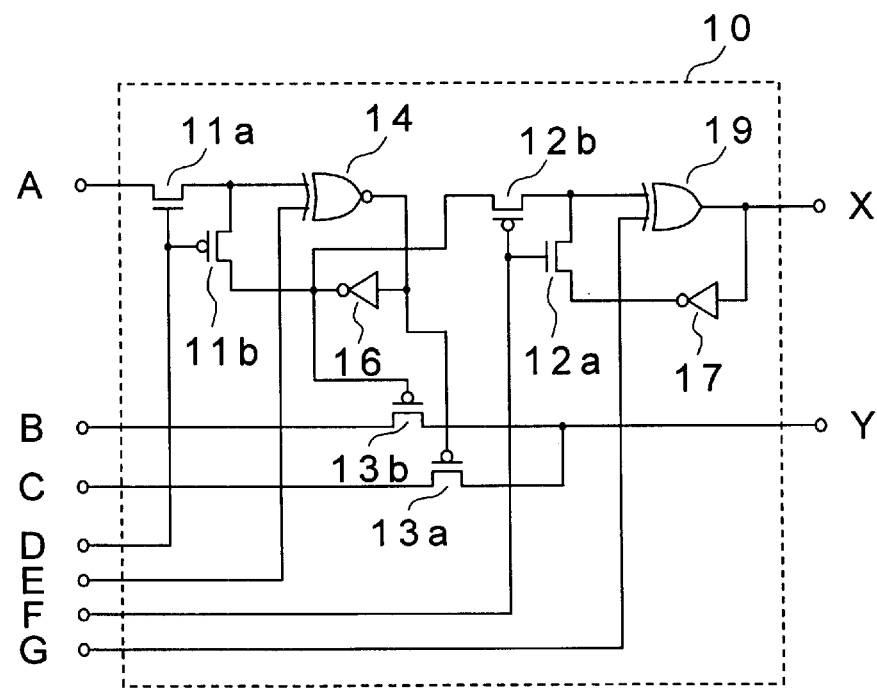
FIG. 24 is a diagram showing yet another example of the configuration of the logic module constituting the variable function information processor according to the sixth embodiment of the present invention.

FIG. 22 to FIG. 24 are diagrams showing other examples of the configuration of the logic module in the sixth embodiment.

The logic module 10 shown in each of FIG. 22 to FIG. 24 and the logic module 10 shown in FIG. 21 are different in a signal for controlling the switching circuits 13a and 13b for selectively transmitting the signals Sb and Sc inputted respectively from the input terminals B and C to the output terminal Y, and the configuration of the logic module 10 shown in each of FIG. 22 to FIG. 24 and the configuration of the logic module 10 shown in FIG. 21 are different from each other. The signal for controlling the switching circuits 13a and 13b is the output signal of the inverter 16 in the logic module 10 shown in FIG. 22, but both the output signal of the two-input exclusive-NOR circuit 14 and the output signal of the inverter 16 in the logic module 10 shown in each of FIG. 23 and FIG. 24. Moreover, with the difference between the signals for controlling the switching circuits 13a and 13b, logic values (a logic high, a logic low) at which the switching circuits 13a and 13b operate also differ according to supplied signals.

It should be mentioned that the operations of the logic modules 10 shown in FIG. 22 to FIG. 24 are the same as that of the logic module shown in FIG. 21.

As explained above, according to the sixth embodiment, by configuring the logic module 10 as shown in each of FIG. 21 to FIG. 24, both the full adding circuit which is the combinational logic circuit and the delay circuit which is the sequential circuit can be realized by the same logic module 10. Further, by using a common part of a semiconductor circuit element group constituting the full adding circuit and the delay circuit respectively for both the circuits, the number of transistors constituting the logic module 10 can be effectively decreased.

In this case, the two-input exclusive-NOR circuits 14 shown in FIG. 21 to FIG. 24 can be structured, for example, by circuits shown in FIG. 33A and FIG. 33B, and the two-input exclusive-OR circuits 19 can be structured, for example, by circuits shown in FIG. 34A and FIG. 34B. Thereby, it becomes possible that the two-input exclusive-NOR circuit 14 and the two-input exclusive-OR circuit 19 are each composed of four transistors, whereby the number of transistors composing the logic module 10 can be effectively decreased.

In the logic module 10 in the sixth embodiment shown in each of FIG. 21 to FIG. 24, the number of transistors necessary to constitute the logic module 10 is 18, and consequently a function almost equal to that in the aforementioned conventional example can be realized by the number of transistors not more than a half of 42 which is the number of transistors necessary in the aforementioned conventional example.

Seventh Embodiment

Next, regarding a logic module constituting a variable function information processor according to the seventh embodiment of the present invention, its configuration and operation will be explained.

Figure 25:
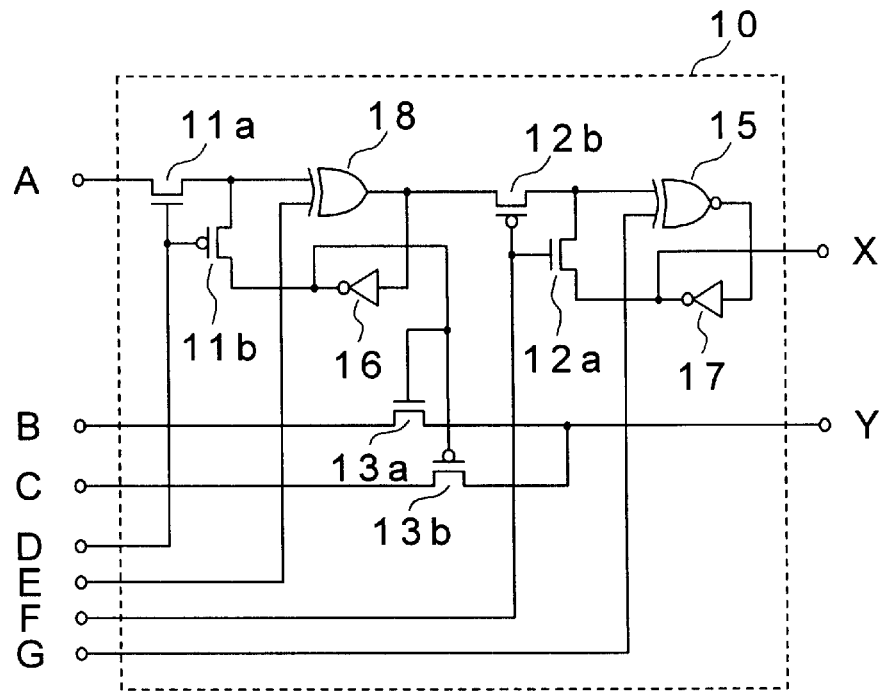
FIG. 25 is a diagram showing an example of a configuration of a logic module constituting a variable function information processor according to a seventh embodiment of the present invention.

FIG. 25 is a diagram showing an example of the configuration of the logic module in the seventh embodiment.

In FIG. 25, a switching circuit 11a selects whether or not to output a signal Sa inputted from an input terminal A, and a switching circuit 11b selects whether or not to output an output signal of an inverter 16. The switching circuits 11a and 11b are designed such that either of them selectively becomes ON according to a signal Sd inputted from an input terminal D to transmit the signal Sa or the output signal of the inverter 16 to a two-input exclusive-OR circuit 18 as one input signal. The other input signal of the two-input exclusive-OR circuit 18 is a signal Se inputted from an input terminal E. An output signal of the two-input exclusive-OR circuit 18 is inputted to the inverter 16 as an input signal.

A switching circuit 12a selects whether or not to output an output signal of an inverter 17, and a switching circuit 12b selects whether or not to output the output signal of the two-input exclusive-OR circuit 18. The switching circuits 12a and 12b are designed to selectively become ON according to a signal Sf inputted from an input terminal F to transmit the output signal of the inverter 17 or the output signal of the two-input exclusive-OR circuit 18 to a two-input exclusive-NOR circuit 15 as one input signal. The other input signal of the two-input exclusive-NOR circuit 15 is a signal Sg inputted from an input terminal G. An output signal of the two-input exclusive-NOR circuit 15 is inputted to the inverter 17 as an input signal.

Further, an output terminal of the inverter 17 and an output terminal X of a logic module 10 are connected to each other, and the output signal of the inverter 17 is outputted as an output signal Sx of the logic module 10. Furthermore, the output signal of the inverter 16 is supplied to switching circuits 13a and 13b respectively. The switching circuits 13a and 13b are controlled by the output signal of the inverter 16 so that a signal Sb inputted from an input terminal B or a signal Sc inputted from an input terminal C is selectively transmitted to an output terminal Y. Thus, the signal Sb or Sc transmitted selectively is outputted as an output signal Sy of the logic module 10 from the output terminal Y.

In FIG. 25, a logic high is applied to the switching circuits 11a and 11b from the input terminal D and a logic low is applied to the switching circuits 12a and 12b from the input terminal F so that the switching circuits 11a and 12b become ON and that the switching circuits 11b and 12a become OFF. Moreover, an input signal Ia is inputted from the input terminal A, an input signal Ib is inputted from each of the input terminals B and E, and similarly, an input signal Ic is inputted from each of the input terminals C and G. On this occasion, a sum and a carry of the input signals Ia, Ib, and Ic are outputted respectively as the output signals Sx and Sy from the output terminals X and Y. Namely, the logic module 10 operates as a full adding circuit of a combinational logic circuit.

Moreover, in FIG. 25, a logic high is inputted to the two-input exclusive-OR circuit 18 from the input terminal E, and a logic low is applied to the two-input exclusive-NOR circuit 15 from the input terminal G so that the two-input exclusive-OR circuit 18 and the two-input exclusive-NOR circuit 15 substantially operate as inverters, and clock signals are inputted from the input terminals D and F to the switching circuits 11a and 11b, and 12a and 12b. On this occasion, the input signal Ia inputted from the input terminal A is delayed in synchronization with the clock signals and outputted as the output signal Sx from the output terminal X. In other words, the logic module 10 operates as a delay circuit (D-type flip-flop) of a sequential circuit. Incidentally, when the logic module 10 is operated as the delay circuit of the sequential circuit, input signals inputted from the input terminals B and C are optional.

The cases where the logic module shown in FIG. 25 operates as the full adding circuit (full adder) and operates as the delay circuit (D-type flip-flop) are explained above, but operations by the logic module shown in FIG. 25 are not limited to the aforementioned two operations. It is needless to say that in the logic module in the seventh embodiment of the present invention, by inputting predetermined input signals from the input terminals A to G, various kinds of combinational logic circuits including a selector circuit which selects any one of inputted input signals and outputs it, for example, can be realized.

Figure 26:
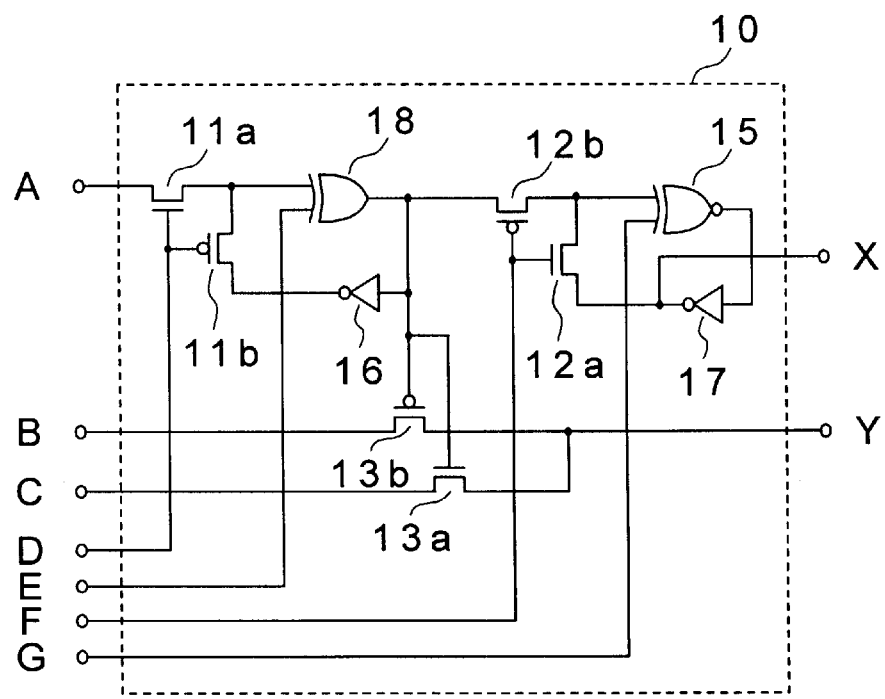
FIG. 26 is a diagram showing another example of the configuration of the logic module constituting the variable function information processor according to the seventh embodiment of the present invention.
Figure 27:
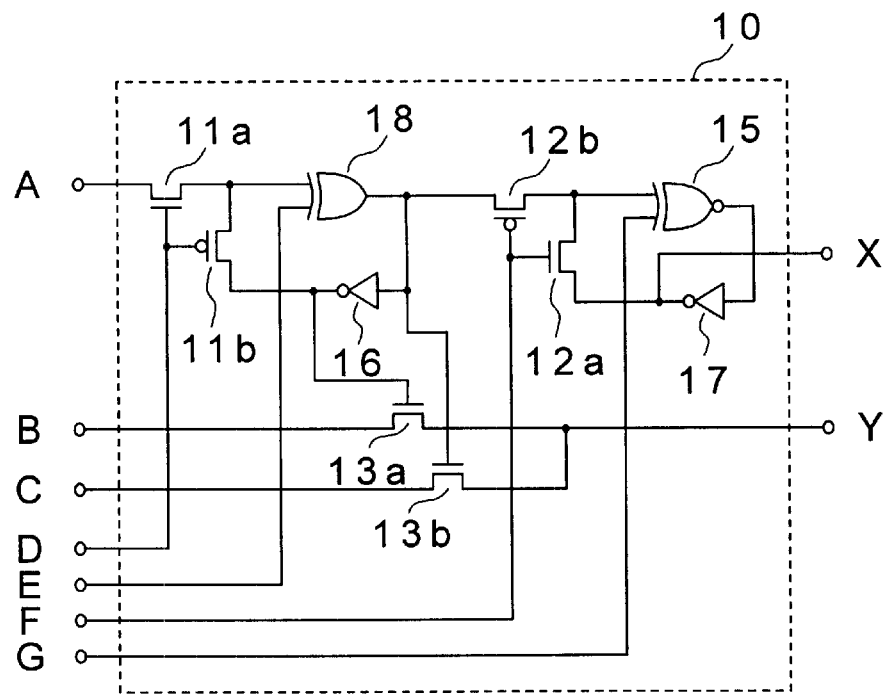
FIG. 27 is a diagram showing still another example of the configuration of the logic module constituting the variable function information processor according to the seventh embodiment of the present invention.
Figure 28:
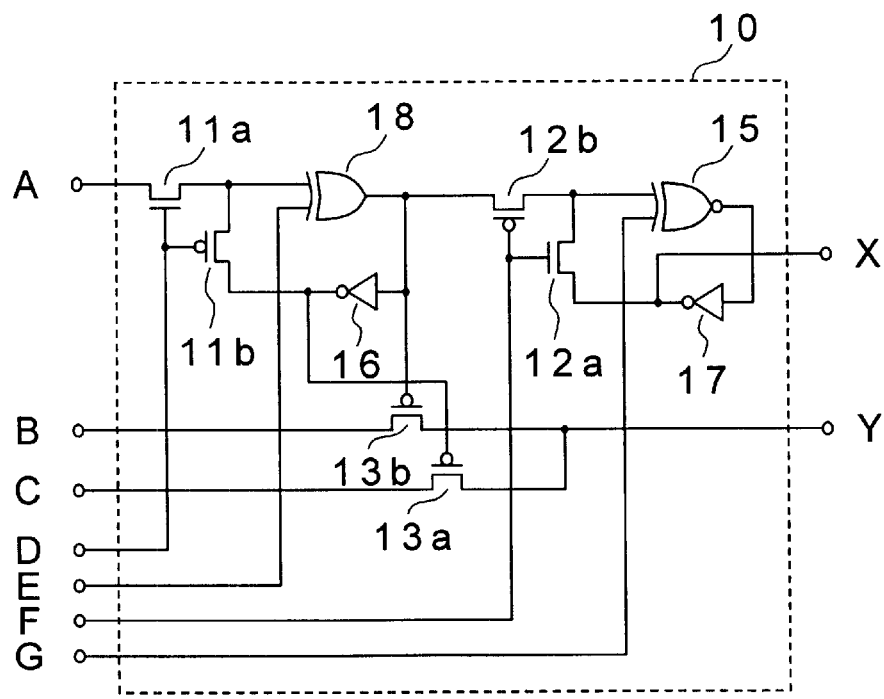
FIG. 28 is a diagram showing yet another example of the configuration of the logic module constituting the variable function information processor according to the seventh embodiment of the present invention.

FIG. 26 to FIG. 28 are diagrams showing other examples of the configuration of the logic module in the seventh embodiment.

The logic module 10 shown in each of FIG. 26 to FIG. 28 and the logic module 10 shown in FIG. 25 are different in a signal for controlling the switching circuits 13a and 13b for selectively transmitting the signals Sb and Sc inputted respectively from the input terminals B and C to the output terminal Y, and the configuration of the logic module 10 shown in each of FIG. 26 to FIG. 28 and the configuration of the logic module 10 shown in FIG. 25 are different from each other. The signal for controlling the switching circuits 13a and 13b is the output signal of the two-input exclusive-OR circuit 18 in the logic module 10 shown in FIG. 26, but both the output signal of the two-input exclusive-OR circuit 18 and the output signal of the inverter 16 in the logic module 10 shown in each of FIG. 27 and FIG. 28. Moreover, with the difference between the signals for controlling the switching circuits 13a and 13b, logic values (a logic high, a logic low) at which the switching circuits 13a and 13b operate also differ according to supplied signals.

It should be mentioned that the operations of the logic modules 10 shown in FIG. 26 to FIG. 28 are the same as that of the logic module shown in FIG. 25.

As explained above, according to the seventh embodiment, by configuring the logic module 10 as shown in each of FIG. 25 to FIG. 28, both the full adding circuit which is the combinational logic circuit and the delay circuit which is the sequential circuit can be realized by the same logic module 10. Further, by using a common part of a semiconductor circuit element group constituting the full adding circuit and the delay circuit respectively for both the circuits, the number of transistors constituting the logic module 10 can be effectively decreased.

In this case, the two-input exclusive-NOR circuits 15 shown in FIG. 25 to FIG. 28 can be structured, for example, by circuits shown in FIG. 33A and FIG. 33B, and the two-input exclusive-OR circuits 18 can be structured, for example, by circuits shown in FIG. 34A and FIG. 34B. Thereby, it becomes possible that the two-input exclusive-NOR circuit 15 and the two-input exclusive-OR circuit 18 are each composed of four transistors, whereby the number of transistors composing the logic module 10 can be effectively decreased.

In the logic module 10 in the seventh embodiment shown in each of FIG. 25 to FIG. 28, the number of transistors necessary to constitute the logic module 10 is 18, and consequently a function almost equal to that in the aforementioned conventional example can be realized by the number of transistors not more than a half of 42 which is the number of transistors necessary in the aforementioned conventional example.

Eighth Embodiment

Next, regarding a logic module constituting a variable function information processor according to the eighth embodiment of the present invention, its configuration and operation will be explained.

Figure 29:
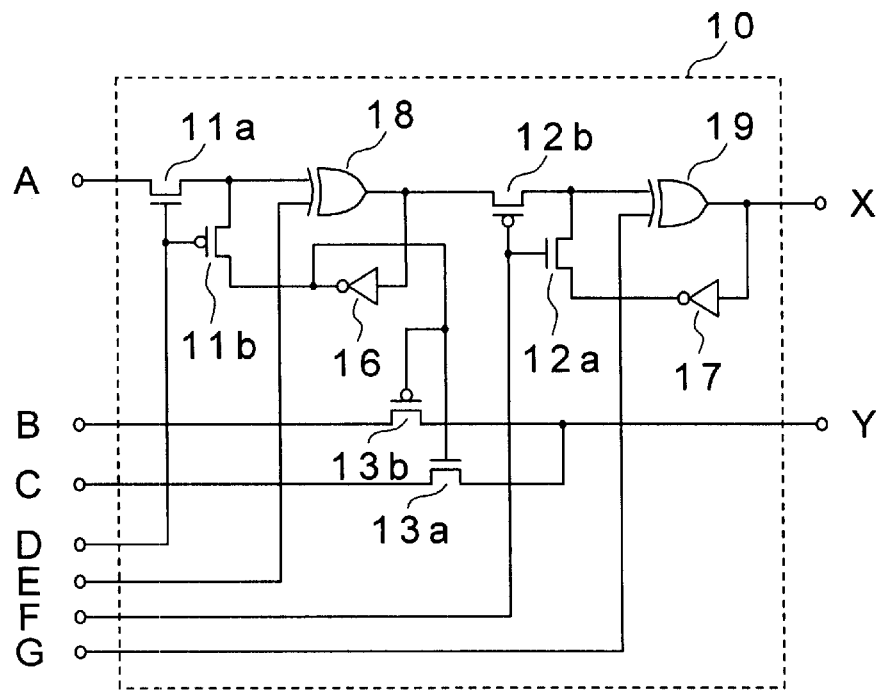
FIG. 29 is a diagram showing an example of a configuration of a logic module constituting a variable function information processor according to an eighth embodiment of the present invention.

FIG. 29 is a diagram showing an example of the configuration of the logic module in the eighth embodiment.

In FIG. 29, a switching circuit 11a selects whether or not to output a signal Sa inputted from an input terminal A, and a switching circuit 11b selects whether or not to output an output signal of an inverter 16. The switching circuits 11a and 11b are designed such that either of them selectively becomes ON according to a signal Sd inputted from an input terminal D to transmit the signal Sa or the output signal of the inverter 16 to a two-input exclusive-OR circuit 18 as one input signal. The other input signal of the two-input exclusive-OR circuit 18 is a signal Se inputted from an input terminal E. An output signal of the two-input exclusive-OR circuit 18 is inputted as an input signal to the inverter 16.

A switching circuit 12a selects whether or not to output an output signal of an inverter 17, and a switching circuit 12b selects whether or not to output the output signal of the two-input exclusive-OR circuit 18. The switching circuits 12a and 12b are designed to selectively become ON according to a signal Sf inputted from an input terminal F to transmit the output signal of the inverter 17 or the output signal of the two-input exclusive-OR circuit 18 to a two-input exclusive-OR circuit 19 as one input signal. The other input signal of the two-input exclusive-OR circuit 19 is a signal Sg inputted from an input terminal G. An output signal of the two-input exclusive-OR circuit 19 is inputted as an input signal to the inverter 17.

Further, an output terminal of the two-input exclusive-OR circuit 19 and an output terminal X of a logic module 10 are connected to each other, and the output signal of the two-input exclusive-OR circuit 19 is outputted as an output signal Sx of the logic module 10. Furthermore, the output signal of the inverter 16 is supplied to switching circuits 13a and 13b respectively. The switching circuits 13a and 13b are controlled by the output signal of the inverter 16 so that a signal Sb inputted from an input terminal B or a signal Sc inputted from an input terminal C is selectively transmitted to an output terminal Y. Thus, the signal Sb or Sc transmitted selectively is outputted as an output signal Sy of the logic module 10 from the output terminal Y.

In FIG. 29, a logic high is applied to the switching circuits 11a and 11b from the input terminal D and a logic low is applied to the switching circuits 12a and 12b from the input terminal F so that the switching circuits 11a and 12b become ON and that the switching circuits 11b and 12a become OFF. Moreover, an input signal Ia is inputted from the input terminal A, an input signal Ib is inputted from each of the input terminals B and E, and similarly, an input signal Ic is inputted from each of the input terminals C and G. On this occasion, a sum and a carry of the input signals Ia, Ib, and Ic are outputted respectively as the output signals Sx and Sy from the output terminals X and Y. Namely, the logic module 10 operates as a full adding circuit of a combinational logic circuit.

Moreover, in FIG. 29, logic highs are inputted to the two-input exclusive-OR circuits 18 and 19 from the input terminals E and G respectively so that the two-input exclusive-OR circuits 18 and 19 substantially operate as inverters, and clock signals are inputted from the input terminals D and F to the switching circuits 11a and 11b, and 12a and 12b. On this occasion, the input signal Ia inputted from the input terminal A is delayed in synchronization with the clock signals and outputted as the output signal Sx from the output terminal X. In other words, the logic module 10 operates as a delay circuit (D-type flip-flop) of a sequential circuit. Incidentally, when the logic module 10 is operated as the delay circuit of the sequential circuit, input signals inputted from the input terminals B and C are optional.

The cases where the logic module shown in FIG. 29 operates as the full adding circuit (full adder) and operates as the delay circuit (D-type flip-flop) are explained above, but operations by the logic module shown in FIG. 29 are not limited to the aforementioned two operations. It is needless to say that in the logic module in the eighth embodiment of the present invention, by inputting predetermined input signals from the input terminals A to G, various kinds of combinational logic circuits including a selector circuit which selects any one of inputted input signals and outputs it, for example, can be realized.

Figure 30:
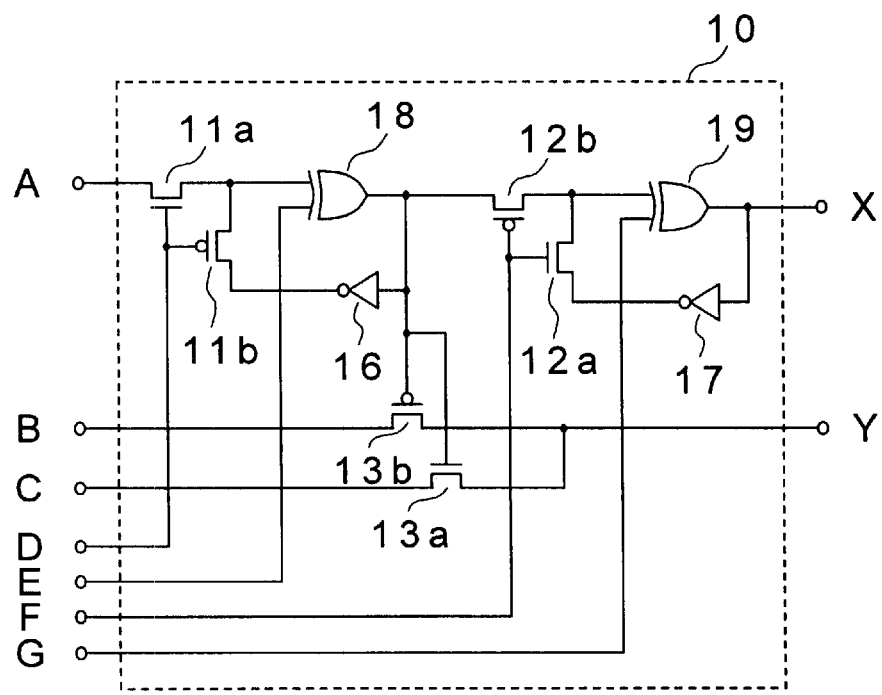
FIG. 30 is a diagram showing another example of the configuration of the logic module constituting the variable function information processor according to the eighth embodiment of the present invention.
Figure 31:
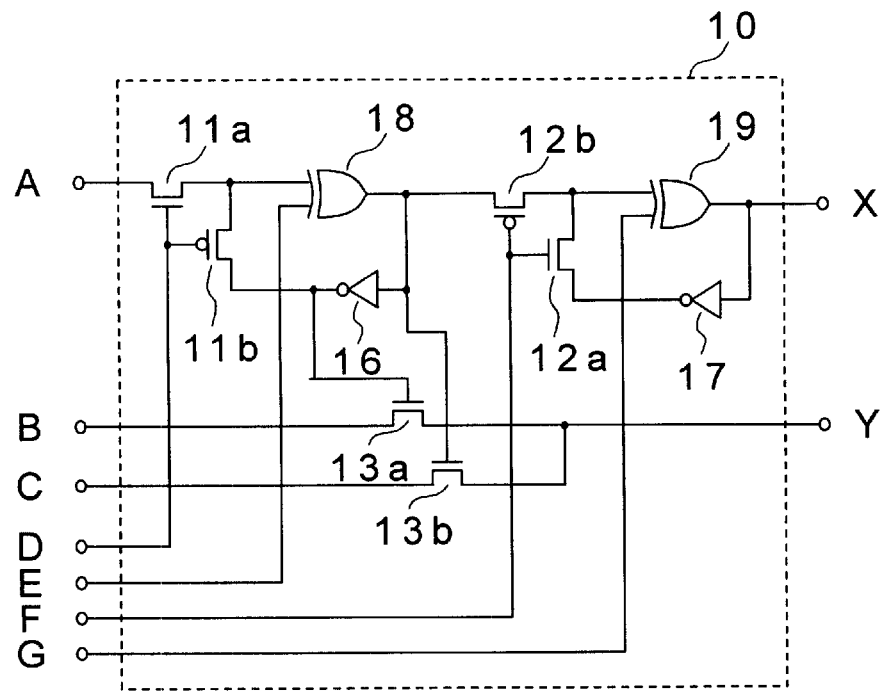
FIG. 31 is a diagram showing still another example of the configuration of the logic module constituting the variable function information processor according to the eighth embodiment of the present invention.
Figure 32:
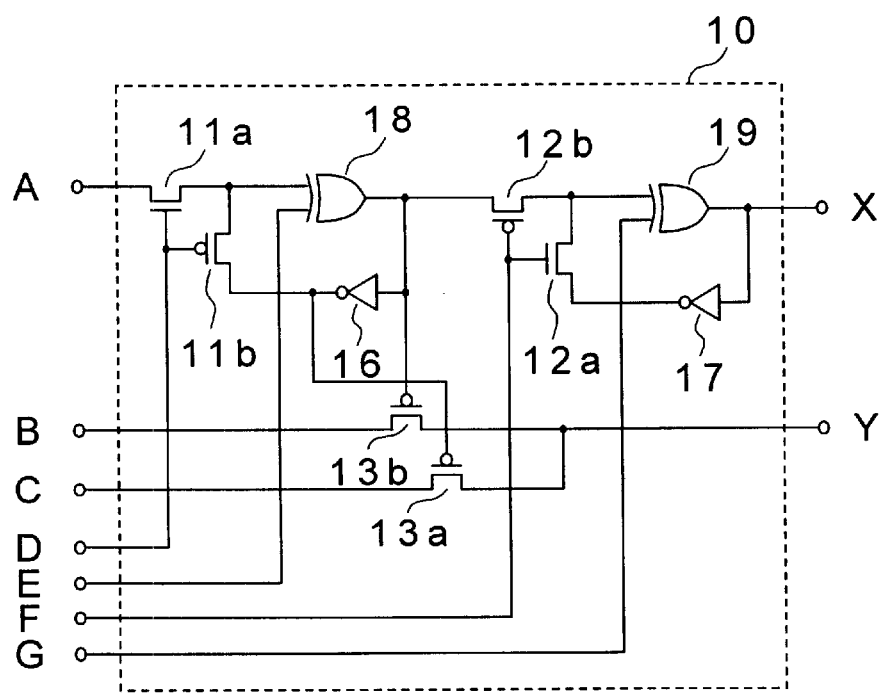
FIG. 32 is a diagram showing yet another example of the configuration of the logic module constituting the variable function information processor according to the eighth embodiment of the present invention.

FIG. 30 to FIG. 32 are diagrams showing other examples of the configuration of the logic module in the eighth embodiment.

The logic module 10 shown in each of FIG. 30 to FIG. 32 and the logic module 10 shown in FIG. 29 are different in a signal for controlling the switching circuits 13a and 13b for selectively transmitting the signals Sb and Sc inputted respectively from the input terminals B and C to the output terminal Y, and the configuration of the logic module 10 shown in each of FIG. 30 to FIG. 32 and the configuration of the logic module 10 shown in FIG. 29 are different from each other. The signal for controlling the switching circuits 13a and 13b is the output signal of the two-input exclusive-OR circuit 18 in the logic module 10 shown in FIG. 30, but both the output signal of the two-input exclusive-OR circuit 18 and the output signal of the inverter 16 in the logic module 10 shown in each of FIG. 31 and FIG. 32. Moreover, with the difference between the signals for controlling the switching circuits 13a and 13b, logic values (a logic high, a logic low) at which the switching circuits 13a and 13b operate also differ according to supplied signals.

It should be mentioned that the operations of the logic modules 10 shown in FIG. 30 to FIG. 32 are the same as that of the logic module shown in FIG. 29.

As explained above, according to the eighth embodiment, by configuring the logic module 10 as shown in each of FIG. 29 to FIG. 32, both the full adding circuit which is the combinational logic circuit and the delay circuit which is the sequential circuit can be realized by the same logic module 10. Further, by using a common part of a semiconductor circuit element group constituting the full adding circuit and the delay circuit respectively for both the circuits, the number of transistors constituting the logic module 10 can be effectively decreased.

In this case, the two-input exclusive-OR circuits 18 and 19 shown in FIG. 29 to FIG. 32 can be structured, for example, by circuits shown in FIG. 34A and FIG. 34B. Thereby, it becomes possible that the two-input exclusive-OR circuits 18 and 19 are each composed of four transistors, whereby the number of transistors composing the logic module 10 can be effectively decreased.

In the logic module 10 in the eighth embodiment shown in each of FIG. 29 to FIG. 32, the number of transistors necessary to constitute the logic module 10 is 18, and consequently a function almost equal to that in the aforementioned conventional example can be realized by the number of transistors not more than a half of 42 which is the number of transistors necessary in the aforementioned conventional example.

Example of Configuration of Two-input Exclusive-NOR Circuit

FIG. 33A and FIG. 33B are diagrams each showing an example of the configurations of the two-input exclusive-NOR circuits 14 and 15 in the aforementioned first to eighth embodiments.

In FIG. 33A, either a switching circuit 21a or 21b in a two-input exclusive-NOR circuit 20 selectively becomes ON according to an input signal I11 inputted from an input terminal IN11. Thereby, an input signal I12 inputted from an input terminal IN12 or an inverted signal of the input signal I12 obtained by an inverter 22 is outputted as an output signal O1 of the two-input exclusive-NOR circuit 20 from an output terminal OUT1.

Moreover, in FIG. 33B, either a switching circuit 26a or 26b in a two-input exclusive-NOR circuit 25 selectively becomes ON according to an input signal I11 inputted from an input terminal IN11, and either a switching circuit 27a or 27b selectively becomes ON according to an input signal I12 inputted from an input terminal IN12. Thereby, at least either the input signal I11 or the input signal I12, or a logic high is outputted as an output signal O1 of the two-input exclusive-NOR circuit 25 from an output terminal OUT1.

In other words, in each of the circuits shown in FIG. 33A and FIG. 33B, when both the input signals I11 and I12, which are respectively inputted from the input terminals IN11 and IN12, are at the same level as a logic low or as a logic high, the logic high is outputted as the output signal O1 from the output terminal OUT1, and when the input signal I11 and the input signal I12 are not at the same level, the logic low is outputted as the output signal O1 from the output signal OUT1, whereby it is known that the two-input exclusive-NOR circuits 20 and 25 each perform a two-input exclusive-NOR operation correctly.

Example of Configuration of Two-input Exclusive-OR Circuit

FIG. 34A and FIG. 34B are diagrams each showing an example of the configurations of the two-input exclusive-OR circuits 18 and 19 in the aforementioned first to eighth embodiments.

In FIG. 34A, either a switching circuit 31a or 31b in a two-input exclusive-OR circuit 30 selectively becomes ON according to an input signal I21 inputted from an input terminal IN21. Thereby, an input signal I22 inputted from an input terminal IN22 or an inverted signal of the input signal I22 obtained by an inverter 32 is outputted as an output signal O2 of the two-input exclusive-OR circuit 30 from an output terminal OUT2.

Moreover, in FIG. 34B, either a switching circuit 36a or 3b in a two-input exclusive-OR circuit 35 selectively becomes ON according to an input signal I21 inputted from an input terminal IN21, and either a switching circuit 37a or 37b selectively becomes ON according to an input signal I22 inputted from an input terminal IN22. Thereby, at least either the input signal I21 or the input signal I22, or a logic low is outputted as an output signal O2 of the two-input exclusive-OR circuit 35 from an output terminal OUT2.

In other words, in each of the circuits shown in FIG. 34A and FIG. 34B, when both the input signals I21 and I22, which are respectively inputted from the input terminals IN21 and IN22, are at the same level as a logic low or as a logic high, the logic low is outputted as the output signal O2 from the output terminal OUT2, and when the input signal I21 and the input signal I22 are not at the same level, the logic high is outputted as the output signal O2 from the output signal OUT2, whereby it is known that the two-input exclusive-OR circuits 30 and 35 each perform a two-input exclusive-OR operation correctly.

Through the use of such two-input exclusive-NOR circuits and two-input exclusive-OR circuits as described above, it becomes possible that a two-input exclusive-NOR circuit and a two-input exclusive-OR circuit, each of which generally requires ten or more transistors, are each composed of four transistors, whereby the number of transistors composing a logic module can be effectively decreased.

Ninth Embodiment

Next, regarding a logic module constituting a variable function information processor according to the ninth embodiment of the present invention, its configuration and operation will be explained.

Figure 35:
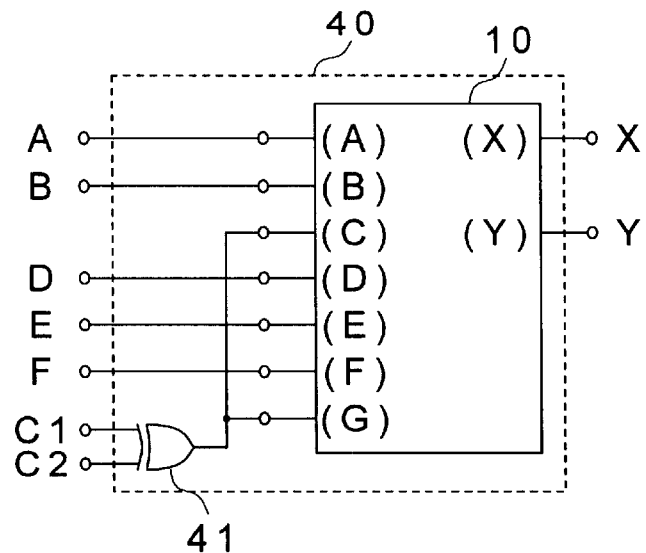
FIG. 35 is a diagram showing an example of a configuration of a logic module constituting a variable function information processor according to a ninth embodiment of the present invention.

FIG. 35 is a diagram showing an example of the configuration of the logic module in the ninth embodiment.

In the ninth embodiment, as shown in FIG. 35, an output terminal of a two-input exclusive-OR circuit 41 and input terminals C and G in a logic module 10 are connected, and the two-input exclusive-OR circuit 41 and the logic module 10 together are defined as a new logic module 40. Incidentally, the above logic module 10 is the logic module 10 in each of the aforementioned first to eighth embodiments. Moreover, as shown in FIG. 35, input terminals of the new logic module 40 are represented by A, B, D, E, F, C1, and C2, and output terminals of the new logic module 40 are represented by X and Y.

In FIG. 35, a logic high is applied to switching circuits 11a and 11b from the input terminal D and a logic low is applied to switching circuits 12a and 12b from the input terminal F such that the switching circuits 11a and 12b in the logic module 10 become ON and that switching circuits 11b and 12a therein become OFF. Further, an input signal Ia is inputted from the input terminal A, an input signal Ib is inputted from each of the input terminals B and E, and similarly, an input signal Ic1 is inputted from the input terminal C1.

When the input signals are inputted respectively from the input terminals A, B, D, E, F, and C1 as stated above and a logic low is inputted from the input terminal C2, a sum and a carry of the input signals Ia, Ib, and Ic are outputted as output signals Sx and Sy from the output terminals X and Y respectively. Namely, the logic module 40 operates as an adding circuit for performing an addition operation represented by an expression (Ia+Ib+Ic).

Meanwhile, when the input signals are inputted respectively from the input terminals A, B, D, E, F, and C1 as stated above and a logic high is inputted from the input terminal C2, a sum and a carry of the input signals Ia and Ib, and an inverted signal of the input signal Ic are outputted as the output signals Sx and Sy from the output terminals X and Y respectively. Namely, the logic module 40 operates as a subtracting circuit for performing a subtraction operation represented by an expression (Ia+Ib−Ic).

Furthermore, in FIG. 35, predetermined signals are applied to a two-input exclusive-NOR circuit and a two-input exclusive-OR circuit used in the logic module 10 from the input terminals E, C1, and C2 so that the two-input exclusive-NOR circuit and the two-input exclusive-OR circuit substantially operate as inverters, and clock signals are inputted from the input terminals D and F to the switching circuits 11a and 11b, and 12a and 12b in the logic module 10. On this occasion, the input signal Ia inputted from the input terminal A is delayed in synchronization with the clock signals and outputted as the output signal Sx from the output terminal X. In other words, the new logic module 40 operates as a delay circuit (D-type flip-flop) of a sequential circuit. Incidentally, when the logic module 40 is operated as the delay circuit of the sequential circuit, an input signal inputted from the input terminal B is optional.

The cases where the logic module 40 shown in FIG. 35 operates as the adding circuit (adder), operates as the subtracting circuit (subtracter), and operates as the delay circuit (D-type flip-flop) are explained above, but operations by the logic module 40 shown in FIG. 35 are not limited to the aforementioned three operations. It is needless to say that in the logic module in the ninth embodiment of the present invention, by inputting predetermined input signals from the input terminals A, B, D, E, F, C1, and C2, various kinds of combinational logic circuits including a selector circuit which selects any one of inputted input signals and outputs it, for example, can be realized.

As explained above, according to the ninth embodiment, by configuring the logic module 40 as shown in FIG. 35, both the adding/subtracting circuit which is the combinational logic circuit and the delay circuit which is the sequential circuit can be realized by the same logic module 40. Further, by using a common part of a semiconductor circuit element group constituting the adding/subtracting circuit and the delay circuit respectively for both the circuits, the number of transistors constituting the logic module 40 can be effectively decreased.

Tenth Embodiment

Next, regarding a logic module constituting a variable function information processor according to the tenth embodiment of the present invention, its configuration and operation will be explained.

Figure 36:
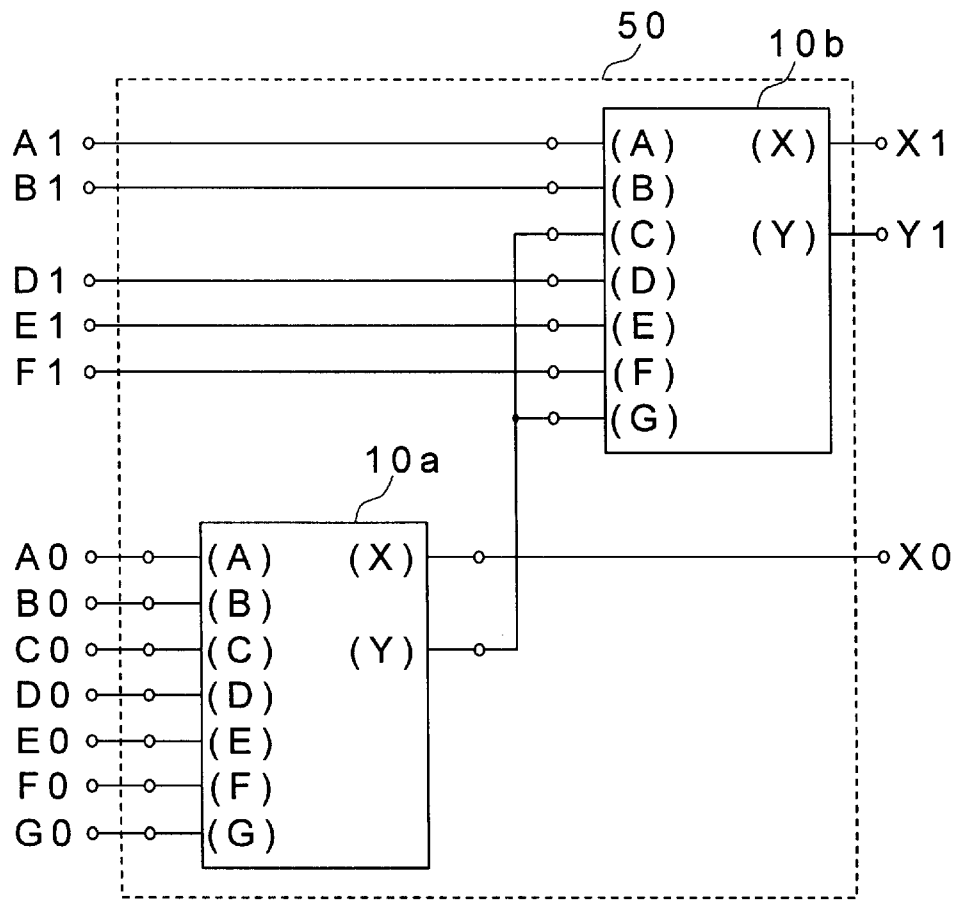
FIG. 36 is a diagram showing an example of a configuration of a logic module constituting a variable function information processor according to a tenth embodiment of the present invention.

FIG. 36 is a diagram showing an example of the configuration of the logic module in the tenth embodiment.

In the tenth embodiment, as shown in FIG. 36, an output terminal Y of a logic module 10a which is one of the logic modules 10 in the aforementioned first to eighth embodiments and input terminals C and G of a logic module 10b which is another of the logic modules 10 are connected, and the logic module 10a and the logic module 10b together are defined as a new logic module 50. Moreover, as shown in FIG. 36, input terminals of the new logic module 50 are represented by A1, B1, D1, E1, A0, B0, C0, D0, E0, F0, and G0, and output terminals of the new logic module 50 are represented by X0, X1, and Y1.

In FIG. 36, logic highs are applied to switching circuits 11a and 11b in the logic modules 10a and 10b from the input terminals D0 and D1 respectively and logic lows are applied to switching circuits 12a and 12b in the logic modules 10a and 10b from the input terminals F0 and F1 respectively such that the switching circuits 11a and 12b in the logic modules 10a and 10b become ON and the switching circuits 11b and 12a therein become OFF. Further, input signals Ia0 and Ia1 are inputted from the input terminals A0 and A1 respectively, an input signal Ib0 is inputted from each of the input terminals B0 and E0, an input signal Ib1 is inputted from each of the input terminals BT and E1, and similarly, a logic low is inputted from each of the input terminals C0 and G0. On this occasion, an operation result corresponding to the sum of an input signal AI {Ia1, Ia0} and an input signal BI {Ib1, Ib0} each of two bits is outputted to an output signal XO {Sy1, Sx1, Xx0} of three bits composed of output signals Sy1, Sx1, and Sx0 outputted from the output terminals Y1, X1, and X0 respectively, and the logic module 50 operates as a 2-bit adding circuit for performing a 2-bit addition operation shown by an expression (XO{Sy1, Sx1, Sx0}=AI{Ia1, Ia0}+{Ib1, Ib0}).

Furthermore, in FIG. 36, predetermined signals are applied to a two-input exclusive-NOR circuit and a two-input exclusive-OR circuit used in the logic modules 10a and 10b from the input terminals E1, B0, C0, E0, and G0 so that the two-input exclusive-NOR circuit and the two-input exclusive-OR circuit substantially operate as inverters, and clock signals are inputted from the input terminals D0, D1, F0, and F1 to the switching circuits 11a, 11b, 12a, and 12b in the logic modules 10a and 10b. On this occasion, the input signals Ia0 and Ia1 inputted from the input terminals A0 and A1 respectively are delayed in synchronization with the clock signals and outputted as the output signals Sx0 and Sx1 from the output terminals X0 and X1 respectively. In other words, the new logic module 50 operates as a parallel 2-bit delay circuit (D-type flip-flop).

The cases where the logic module 50 shown in FIG. 36 operates as the 2-bit adding circuit and operates as the parallel 2-bit delay circuit (D-type flip-flop) are explained above, but operations by the logic module 50 shown in FIG. 36 are not limited to the aforementioned two operations. It is needless to say that in the logic module in the tenth embodiment of the present invention, by inputting predetermined input signals from the input terminals A1, B1, D1, E1, F1, and A0 to G0, various kinds of combinational logic circuits including a selector circuit which selects any one of inputted input signals and outputs it, for example, can be realized.

As explained above, according to the tenth embodiment, by configuring the logic module 50 as shown in FIG. 36, both the 2-bit adding circuit which is the combinational logic circuit and the parallel 2-bit delay circuit which is the sequential circuit can be realized by the same logic module 50. Further, by using a common part of a semiconductor circuit element group constituting the 2-bit adding circuit and the parallel 2 bit delay circuit respectively for both the circuits, the number of transistors constituting the logic module 50 can be effectively decreased.

Eleventh Embodiment

Next, regarding a variable function information processor according to the eleventh embodiment of the present invention, its configuration and operation will be explained.

Figure 37:
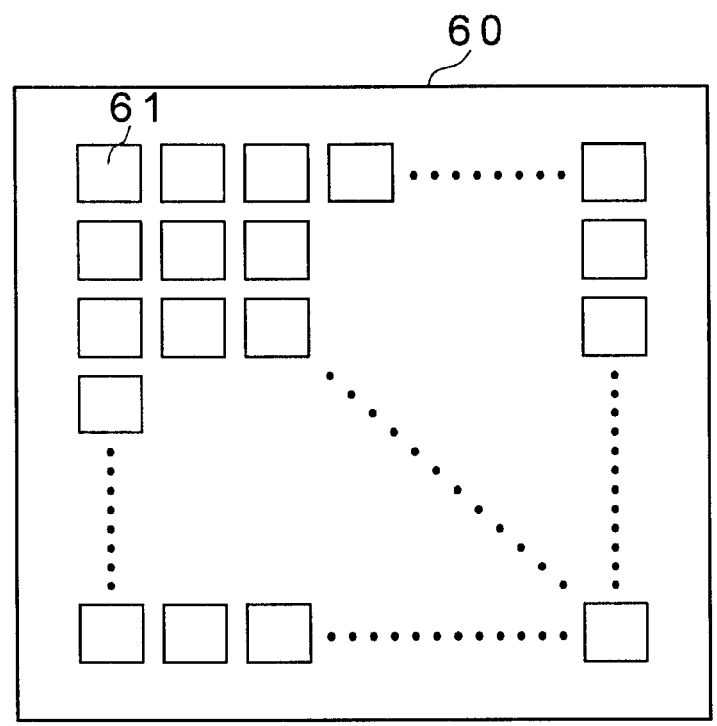
FIG. 37 is a diagram showing an example of a configuration of a variable function information processor according to an eleventh embodiment of the present invention.

FIG. 37 is a diagram showing an example of the configuration of the variable function information processor in the eleventh embodiment.

A variable function information processor 60 according to the eleventh embodiment is a variable function information processor realized by arranging a plurality of one kind or several kinds of logic modules explained in the aforementioned first to tenth embodiments (shown by logic modules 61 in the diagram) and connecting the plurality of logic modules 61 to one other.

The variable function information processor 60 is composed of the plurality of logic modules 61 each having a function of serving both as a combinational logic circuit and as a sequential circuit by predetermined signals, and hence by using the combinational logic circuits and the sequential circuits which the logic modules 61 can provide, the variable function information processor 60 operates as an information processor which performs various kinds of desired information processing.

Moreover, the logic module 61 is a logic module which can use a common part of a semiconductor circuit element group constituting the combinational logic circuit and the sequential circuit respectively for both the circuits to thereby effectively decrease the number of transistors constituting the logic module 61, whereby the variable function information processor 60 the resources of which are effectively exploited is realized by a plurality of logic modules 61.

As explained above, according to the eleventh embodiment, there can be provided the variable function information processor 60 which, in order to integrate logic modules constituting the variable function information processor as many as possible (at the highest possible degree of integration), uses the logic modules 61 the resources of each of which are effectively exploited by realizing both the combinational logic circuit and the sequential circuit by the same logic module, whereby the number of transistors is further decreased.

It should be mentioned that terms "apply", "transmit", and "connect" described in this specification indicate a state of being electrically connected, including a case where a different element is inserted in its electrically connected path.

Moreover, it is easily understood from the aforementioned explanation that the logic module constituting the variable function information processor in each of the aforementioned first to tenth embodiment can realize an equivalent function by changing an exclusive-NOR circuit to an exclusive-OR circuit and according to this change, changing a way of operating a switching circuit and a way of applying a signal, and by changing the configuration of the switching circuit, for example, through the use of a switching logic circuit such as a multiplexer in place of a transistor switch and according to this change, changing a way of applying a signal, and hence please note that the scope of the claims herein embraces all such changes included in the scope of the present invention.

It is needless to say that the logic module constituting the variable function information processor in each of the aforementioned first to tenth embodiments may be used as one circuit element constituting an information processing unit such as a processor, may be used as a master slice such as a gate array, may be used as a basic module such as an FPGA, or may used for other various semiconductor devices.

INDUSTRIAL APPLICABILITY

As described above, according to the present invention, the number of transistors used in a logic module constituting a variable function information processor can be further decreased, and by using the logic module, a variable function information processor in which more logic modules are integrated can be provided. Moreover, both a combinational logic circuit and a sequential circuit can be realized by the same logic module, whereby the resources of the variable function information processor can be effectively exploited.

What is claimed is:

1. A variable function information processor, comprising:
   at least one basic circuit block composed of
      a two-input arithmetic circuit structured by a two-input exclusive-NOR circuit or a two-input exclusive-OR circuit, to which a first signal is inputted as one input signal from a first input terminal,
      an inverter for inverting an output signal of the two-input arithmetic circuit,
      a switching circuit for transmitting an output signal of the inverter or a second signal inputted from a second input terminal as the other input signal to the two-input arithmetic circuit in accordance with a third signal inputted from a third input terminal, and
      an output terminal capable of outputting at least either the output signal of the two-input arithmetic circuit or the output signal of the inverter;
   an input terminal group including the first to third input terminals;
   an output terminal group including the output terminal; and
   a semiconductor arithmetic circuit electrically connected to said input terminal group, said output terminal group, and said basic circuit block,
   wherein a function of serving both as a combinational logic circuit for performing a logical operation of the input signals and as a sequential circuit for performing a sequential operation of the input signal according to the input signals inputted from said input terminal group is provided, and through the use of said basic circuit block, in a semiconductor circuit element group for constituting the combinational logic circuit and the sequential circuit, a common part of the combinational logic circuit and the sequential circuit is used for both the circuits.

2. The variable function information processor according to claim 1,
   wherein said semiconductor arithmetic circuit includes an output switching circuit for selectively outputting any of the input signals inputted from said input terminal group.

3. The variable function information processor according to claim 1,
   wherein a first and a second basic circuit block are provided,
   wherein the first basic circuit block includes:
      a first two-input arithmetic circuit structured by a first two-input exclusive-NOR circuit or a first two-input exclusive-OR circuit, to which a first signal is inputted as one input signal from a first input terminal;
      a first inverter for inverting an output signal of the first two-input arithmetic circuit; and
      a first switching circuit for transmitting an output signal of the first inverter or a second signal inputted from a second input terminal as the other input signal to the first two-input arithmetic circuit in accordance with a third signal inputted from a third input terminal,
   the first basic circuit block outputting the output signal of the first two-input arithmetic circuit or the output signal of the first inverter as an output signal of the-first basic circuit block,
   wherein the second basic circuit block includes:
      a second two-input arithmetic circuit structured by a second two-input exclusive-NOR circuit or a second two-input exclusive-OR circuit, to which a fourth signal is inputted as one input signal from a fourth input terminal;
      a second inverter for inverting an output signal of the second two-input arithmetic circuit; and
      a second switching circuit for transmitting an output signal of the second inverter or the output signal of the first basic circuit block as the other input signal to the second two-input arithmetic circuit in accordance with a fifth signal inputted from a fifth input terminal,
   the second basic circuit block outputting the output signal of the second two-input arithmetic circuit or the output signal of the second inverter via a first external output terminal,
   wherein said semiconductor arithmetic circuit transmits a sixth signal inputted from a sixth input terminal or a seventh signal inputted from a seventh input terminal to a second external output terminal in accordance with at least either the output signal of the first two-input arithmetic circuit or the output signal of the first inverter, and
   wherein a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and in a semiconductor circuit element group for constituting the combinational logic circuit and the sequential circuit, a common part of the combinational logic circuit and the sequential circuit is used for both the circuits.

4. The variable function information processor according to claim 3, further comprising:
   a third two-input arithmetic circuit structured by a third two-input exclusive-NOR circuit or a third two-input exclusive-OR circuit, whose output terminal is electrically connected to at least one of the first to seventh input terminals, wherein a function of serving both as a combinational logic circuit for performing an addition operation or a subtraction operation of a set of the input signals and outputting a result of the operation and as a sequential circuit for temporarily holding the input signal to delay the input signal and outputting it according to input signals inputted from input terminals for inputting input signals to the third two-input arithmetic circuit and the first to seventh input terminals is provided, and in a semiconductor circuit element group for constituting the combinational logic circuit and the sequential circuit, a common part of the combinational logic circuit and the sequential circuit is used for both the circuits.

5. A variable function information processor, wherein a plurality of the variable function information processors according to claim 3 are provided and electrically connected to one another directly or via a semiconductor arithmetic circuit, whereby a new input terminal group is formed by a plurality of input terminals through which input signals are allowed to be inputted from the outside to the variable function information processor, and a new output terminal group is formed by a plurality of output terminals through which output signals are allowed to be outputted from the variable function information processor to the outside, and wherein a function of serving both as a combinational logic circuit and a sequential circuit according to the input signals inputted from the input terminal group is provided, and in a semiconductor circuit element group to constitute the combinational logic circuit and the sequential circuit, a common part of the combinational logic circuit and the sequential circuit is used for both the circuits.

6. The variable function information processor according to claim 1, wherein a first and a second basic circuit block are provided, wherein the first basic circuit block includes:
a first two-input exclusive-NOR circuit, to which a first signal is inputted as one input signal from a first input terminal;
a first inverter for inverting an output signal of the first two-input exclusive-NOR circuit; and
a first switching circuit for transmitting an output signal of the first inverter or a second signal inputted from a second input terminal as the other input signal to the first two-input exclusive-NOR circuit in accordance with a third signal inputted from a third input terminal, wherein the second basic circuit block includes:
a second two-input exclusive-NOR circuit, to which a fourth signal is inputted as one input signal from a fourth input terminal, for outputting an output signal via a first external output terminal;
a second inverter for inverting the output signal of the second two-input exclusive-NOR circuit; and
a second switching circuit for transmitting an output signal of the second inverter or the output signal of the first two-input exclusive-NOR circuit as the other input signal to the second two-input exclusive-NOR circuit in accordance with a fifth signal inputted from a fifth input terminal, wherein said semiconductor arithmetic circuit transmits a sixth signal inputted from a sixth input terminal or a seventh signal inputted from a seventh input terminal to a second external output terminal in accordance with at least either the output signal of the first two-input exclusive-NOR circuit or the output signal of the first inverter, and wherein a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and in a semiconductor circuit element group for constituting the combinational logic circuit and the sequential circuit, a common part of the combinational logic circuit and the sequential circuit is used for both the circuits.

7. The variable function information processor according to claim 1, wherein a first and a second basic circuit block are provided, wherein the first basic circuit block includes:
a two-input exclusive-NOR circuit, to which a first signal is inputted as one input signal from a first input terminal;
a first inverter for inverting an output signal of the two-input exclusive-NOR circuit; and
a first switching circuit for transmitting an output signal of the first inverter or a second signal inputted from a second input terminal as the other input signal to the two-input exclusive-NOR circuit in accordance with a third signal inputted from a third input terminal, wherein the second basic circuit block includes:
a two-input exclusive-OR circuit, to which a fourth signal is inputted as one input signal from a fourth input terminal;
a second inverter for inverting an output signal of the two-input exclusive-OR circuit and outputting an output signal via a first external output terminal; and
a second switching circuit for transmitting the output signal of the second inverter or the output signal of the two-input exclusive-NOR circuit as the other input signal to the two-input exclusive-OR circuit in accordance with a fifth signal inputted from a fifth input terminal, wherein said semiconductor arithmetic circuit transmits a sixth signal inputted from a sixth input terminal or a seventh signal inputted from a seventh input terminal to a second external output terminal in accordance with at least either the output signal of the two-input exclusive-NOR circuit or the output signal of the first inverter, and wherein a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and in a semiconductor circuit element group for constituting the combinational logic circuit and the sequential circuit, a common part of the combinational logic circuit and the sequential circuit is used for both the circuits.

8. The variable function information processor according to claim 1, wherein a first and a second basic circuit block are provided, wherein the first basic circuit block includes:
- a two-input exclusive-OR circuit, to which a first signal is inputted as one input signal from a first input terminal;
- a first inverter for inverting an output signal of the two-input exclusive-OR circuit; and
- a first switching circuit for transmitting an output signal of the first inverter or a second signal inputted from a second input terminal as the other input signal to the two-input exclusive-OR circuit in accordance with a third signal inputted from a third input terminal, wherein the second basic circuit block includes:
- a two-input exclusive-NOR circuit, to which a fourth signal is inputted as one input signal from a fourth input terminal, for outputting an output signal via a first external output terminal;
- a second inverter for inverting the output signal of the two-input exclusive-NOR circuit; and
- a second switching circuit for transmitting an output signal of the second inverter or the output signal of the first inverter as the other input signal to the two-input exclusive-NOR circuit in accordance with a fifth signal inputted from a fifth input terminal, wherein said semiconductor arithmetic circuit transmits a sixth signal inputted from a sixth input terminal or a seventh signal inputted from a seventh input terminal to a second external output terminal in accordance with at least either the output signal of the two-input exclusive-OR circuit or the output signal of the first inverter, and wherein a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and in a semiconductor circuit element group for constituting the combinational logic circuit and the sequential circuit, a common part of the combinational logic circuit and the sequential circuit is used for both the circuits.

9. The variable function information processor according to claim 1, wherein a first and a second basic circuit block are provided, wherein the first basic circuit block includes:
- a first two-input exclusive-OR circuit, to which a first signal is inputted as one input signal from a first input terminal;
- a first inverter for inverting an output signal of the first two-input exclusive-OR circuit; and
- a first switching circuit for transmitting an output signal of the first inverter or a second signal inputted from a second input terminal as the other input signal to the first two-input exclusive-OR circuit in accordance with a third signal inputted from a third input terminal, wherein the second basic circuit block includes:
- a second two-input exclusive-OR circuit, to which a fourth signal is inputted as one input signal from a fourth input terminal;
- a second inverter for inverting an output signal of the second two-input exclusive-OR circuit and outputting an output signal via a first external output terminal; and
- a second switching circuit for transmitting the output signal of the second inverter or the output signal of the first inverter as the other input signal to the second two-input exclusive-OR circuit in accordance with a fifth signal inputted from a fifth input terminal, wherein said semiconductor arithmetic circuit transmits a sixth signal inputted from a sixth input terminal or a seventh signal inputted from a seventh input terminal to a second external output terminal in accordance with at least either the output signal of the first two-input exclusive-OR circuit or the output signal of the first inverter, and wherein a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and in a semiconductor circuit element group for constituting the combinational logic circuit and the sequential circuit, a common part of the combinational logic circuit and the sequential circuit is used for both the circuits.

10. The variable function information processor according to claim 1, wherein a first and a second basic circuit block are provided, wherein the first basic circuit block includes:
- a first two-input exclusive-NOR circuit, to which a first signal is inputted as one input signal from a first input terminal;
- a first inverter for inverting an output signal of the first two-input exclusive-NOR circuit; and
- a first switching circuit for transmitting an output signal of the first inverter or a second signal inputted from a second input terminal as the other input signal to the first two-input exclusive-NOR circuit in accordance with a third signal inputted from a third input terminal, wherein the second basic circuit block includes:
- a second two-input exclusive-NOR circuit, to which a fourth signal is inputted as one input signal from a fourth input terminal;
- a second inverter for inverting an output signal of the two-input exclusive-NOR circuit and outputting an output signal via a first external output terminal; and
- a second switching circuit for transmitting the output signal of the second inverter or the output signal of the first inverter as the other input signal to the second two-input exclusive-NOR circuit in accordance with a fifth signal inputted from a fifth input terminal, wherein said semiconductor arithmetic circuit transmits a sixth signal inputted from a sixth input terminal or a seventh signal inputted from a seventh input terminal to a second external output terminal in accordance with at least either the output signal of the first two-input exclusive-NOR circuit or the output signal of the first inverter, and wherein a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and in a semiconductor circuit element group for constituting the combinational logic circuit and the sequential circuit, a common part of the combinational logic circuit and the sequential circuit is used for both the circuits.

11. The variable function information processor according to claim 1,
wherein a first and a second basic circuit block are provided,
wherein the first basic circuit block includes:
a two-input exclusive-NOR circuit, to which a first signal is inputted as one input signal from a first input terminal;
a first inverter for inverting an output signal of the two-input exclusive-NOR circuit; and
a first switching circuit for transmitting an output signal of the first inverter or a second signal inputted from a second input terminal as the other input signal to the two-input exclusive-NOR circuit in accordance with a third signal inputted from a third input terminal,
wherein the second basic circuit block includes:
a two-input exclusive-OR circuit, to which a fourth signal is inputted as one input signal from a fourth input terminal and outputting an output signal via a first external output terminal;
a second inverter for inverting the output signal of the two-input exclusive-OR circuit; and
a second switching circuit for transmitting an output signal of the second inverter or the output signal of the first inverter as the other input signal to the two-input exclusive-OR circuit in accordance with a fifth signal inputted from a fifth input terminal,
wherein said semiconductor arithmetic circuit transmits a sixth signal inputted from a sixth input terminal or a seventh signal inputted from a seventh input terminal to a second external output terminal in accordance with at least either the output signal of the two-input exclusive-NOR circuit or the output signal of the first inverter, and
wherein a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and in a semiconductor circuit element group for constituting the combinational logic circuit and the sequential circuit, a common part of the combinational logic circuit and the sequential circuit is used for both the circuits.

12. The variable function information processor according to claim 1,
wherein a first and a second basic circuit block are provided,
wherein the first basic circuit block includes:
a two-input exclusive-OR circuit, to which a first signal is inputted as one input signal from a first input terminal;
a first inverter for inverting an output signal of the two-input exclusive-OR circuit; and
a first switching circuit for transmitting an output signal of the first inverter or a second signal inputted from a second input-terminal as the other input signal to the two-input exclusive-OR circuit in accordance with a third signal inputted from a third input terminal,
wherein the second basic circuit block includes:
a two-input exclusive-NOR circuit, to which a fourth signal is inputted as one input signal from a fourth input terminal;
a second inverter for inverting an output signal of the two-input exclusive-NOR circuit and outputting an output signal via a first external output terminal; and
a second switching circuit for transmitting the output signal of the second inverter or the output signal of the two-input exclusive-OR circuit as the other input signal to the second two-input exclusive-NOR circuit in accordance with a fifth signal inputted from a fifth input terminal,
wherein said semiconductor arithmetic circuit transmits a sixth signal inputted from a sixth input terminal or a seventh signal inputted from a seventh input terminal to a second external output terminal in accordance with at least either the output signal of the two-input exclusive-OR circuit or the output signal of the first inverter, and
wherein a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and in a semiconductor circuit element group for constituting the combinational logic circuit and the sequential circuit, a common part of the combinational logic circuit and the sequential circuit is used for both the circuits.

13. The variable function information processor according to claim 1,
wherein a first and a second basic circuit block are provided,
wherein the first basic circuit block includes:
a first two-input exclusive-OR circuit, to which a first signal is inputted as one input signal from a first input terminal;
a first inverter for inverting an output signal of the first two-input exclusive-OR circuit; and
a first switching circuit for transmitting an output signal of the first inverter or a second signal inputted from a second input terminal as the other input signal to the first two-input exclusive-OR circuit in accordance with a third signal inputted from a third input terminal,
wherein the second basic circuit block includes:
a second two-input exclusive-OR circuit, to which a fourth signal is inputted as one input signal from a fourth input terminal, for outputting an output signal via a first external output terminal;
a second inverter for inverting the output signal of the second two-input exclusive-OR circuit; and
a second switching circuit for transmitting an output signal of the second inverter or the output signal of the first two-input exclusive-OR circuit as the other input signal to the second two-input exclusive-OR circuit in accordance with a fifth signal inputted from a fifth input terminal,
wherein said semiconductor arithmetic circuit transmits a sixth signal inputted from a sixth input terminal or a seventh signal inputted from a seventh input terminal to a second external output terminal in accordance with at least either the output signal of the first two-input exclusive-OR circuit or the output signal of the first inverter, and wherein a function of serving both as a combinational logic circuit for performing a full addition operation of the input signals and outputting a result of the operation and as a sequential circuit for temporarily holding the input signal to delay the input signal and outputting it according to the input signals inputted from the first to seventh input terminals is provided, and in a semiconductor circuit element group for constituting the combinational logic circuit and the sequential circuit, a common part of the combinational logic circuit and the sequential circuit is used for both the circuits.

14. A variable function information processor, comprising:

at least one basic circuit block composed of a two-input arithmetic circuit, to which a first signal is inputted as one input signal from a first input terminal, for outputting an operation result of a logical operation of the first signal and the other input signal or an inverted signal of the other input signal according to the first signal, an inverter for inverting the output signal of the two-input arithmetic circuit, a switching circuit for selectively supplying an output signal of the inverter or a second signal inputted from a second input terminal as the other input signal to the two-input arithmetic circuit in accordance with a third signal inputted from a third input terminal, and an output terminal capable of outputting at least either the output signal of the two-input arithmetic circuit or the output signal of the inverter, said basic circuit block serving both as a combinational logic circuit and as a sequential circuit according to the input signals inputted from the first to third input terminals, and in semiconductor circuit elements to function as the combinational logic circuit and the sequential circuit respectively, sharing common circuit elements between both the circuits.

15. The variable function information processor according to claim 14, wherein a plurality of said basic circuit blocks are provided, and wherein on the occasion of subordinate connection, the output terminal of said basic circuit block in a preceding stage is connected to the second input terminal of said basic circuit block in a subsequent stage.

16. The variable function information processor according to claim 15, wherein the two-input arithmetic circuit is a two-input exclusive-NOR circuit or a two-input exclusive-OR circuit.

17. The variable function information processor according to claim 16, wherein said basic circuit block functions as an adding circuit or a latch circuit according to the input signal inputted from the first input terminal.

18. The variable function information processor according to claim 17, further comprising:

a semiconductor arithmetic circuit for performing processing in response to a signal inputted; and an external output terminal capable of outputting an output signal of said semiconductor arithmetic circuit, said semiconductor arithmetic circuit performing the processing in response to at least any one signal of the input signal inputted from the first to third input terminals or an external input terminal, the output signal of the two-input arithmetic circuit, and the output signal of the inverter.

19. The variable function information processor according to claim 18, wherein said semiconductor arithmetic circuit includes an output switching circuit for outputting the input signal inputted from the first to third input terminals or the external input terminal according to at least either the output signal of the two-input arithmetic circuit or the output signal of the inverter.

* * * * *